United States Patent
Iguchi

(10) Patent No.: US 12,057,677 B2
(45) Date of Patent: Aug. 6, 2024

(54) LIGHT-EMITTING DEVICE, OPTICAL DEVICE, AND INFORMATION PROCESSING APPARATUS

(71) Applicant: FUJIFILM Business Innovation Corp., Tokyo (JP)

(72) Inventor: Daisuke Iguchi, Kanagawa (JP)

(73) Assignee: FUJIFILM Business Innovation Corp., Tokyo (JP)

(*) Notice: Subject to any disclaimer, the term of this patent is extended or adjusted under 35 U.S.C. 154(b) by 793 days.

(21) Appl. No.: 17/138,907

(22) Filed: Dec. 31, 2020

(65) Prior Publication Data
US 2021/0265811 A1   Aug. 26, 2021

(30) Foreign Application Priority Data
Feb. 26, 2020 (JP) .................. 2020-030593

(51) Int. Cl.
*H01S 5/042* (2006.01)
*G06V 20/64* (2022.01)
(Continued)

(52) U.S. Cl.
CPC ............ *H01S 5/0428* (2013.01); *G06V 20/64* (2022.01); *G06V 40/166* (2022.01); *H01L 31/12* (2013.01);
(Continued)

(58) Field of Classification Search
CPC ............. H01S 5/02469; H01S 5/02476; H01S 5/023–02385; H01S 5/022–0239; H01L 33/64; H01L 33/647
See application file for complete search history.

(56) References Cited

U.S. PATENT DOCUMENTS

| | | |
|---|---|---|
| 10,170,674 B2 | 1/2019 | Miyashita et al. |
| 11,652,092 B2 | 5/2023 | Takimoto et al. |
| | (Continued) | |

FOREIGN PATENT DOCUMENTS

| | | |
|---|---|---|
| JP | 2006066705 | 3/2006 |
| JP | 2008-252129 | 10/2008 |
| | (Continued) | |

OTHER PUBLICATIONS

James Lewis, Low side vs. High side transistor switch, Bald Engineer, [retreived on Nov. 30, 2023]. Retrieved from internet <URL: https://www.baldengineer.com/low-side-vs-high-side-transistor-switch.html#:~:text=The%20low%2Dside%20switch%20is%20switching%20ground%20while%20the%20high,small%20voltage%20drop%20across%.*
(Continued)

*Primary Examiner* — Joshua King
(74) *Attorney, Agent, or Firm* — JCIPRNET

(57) ABSTRACT

A light-emitting device includes an insulating base member having thermal conductivity of 10 W/m·K or more; a light-emitting element provided on a front surface side of the base member; a first rear surface wire that is provided on a rear surface side of the base member and is connected to one of a cathode electrode and an anode electrode of the light-emitting element; a second rear surface wire that is provided on the rear surface side of the base member and is connected to the other one of the cathode electrode and the anode electrode; and a reference potential wire that is provided on the rear surface side of the base member and is connected to an external reference potential.

9 Claims, 15 Drawing Sheets

(51) Int. Cl.
    *G06V 40/16*     (2022.01)
    *H01L 31/12*     (2006.01)
    *H01S 5/02345*     (2021.01)
    *H01S 5/024*     (2006.01)
    *H01S 5/183*     (2006.01)
    *H01S 5/343*     (2006.01)
    *H01S 5/42*     (2006.01)

(52) U.S. Cl.
    CPC ...... *H01S 5/02345* (2021.01); *H01S 5/02469* (2013.01); *H01S 5/18311* (2013.01); *H01S 5/18361* (2013.01); *H01S 5/34313* (2013.01); *H01S 5/423* (2013.01)

(56) References Cited

U.S. PATENT DOCUMENTS

| | | | | |
|---|---|---|---|---|
| 2004/0222433 | A1* | 11/2004 | Mazzochette | H01L 25/0753 257/E33.059 |
| 2013/0049564 | A1* | 2/2013 | Jung | H01L 33/64 313/45 |
| 2016/0072258 | A1* | 3/2016 | Seurin | H01S 5/02345 |
| 2020/0355493 | A1 | 11/2020 | Nakamura et al. | |

FOREIGN PATENT DOCUMENTS

| | | | | |
|---|---|---|---|---|
| JP | 2012021884 A * | 2/2012 | ......... | G01D 5/34715 |
| JP | 2012191042 | 10/2012 | | |
| JP | 2020004868 | 1/2020 | | |
| WO | WO-2013146749 A1 * | 10/2013 | ......... | G02B 19/0057 |
| WO | 2014208495 | 12/2014 | | |
| WO | WO-2019027503 A1 * | 2/2019 | ............. | G06F 21/32 |
| WO | 2019207938 | 10/2019 | | |

OTHER PUBLICATIONS

[Item U continued] 0it.>.*
Cu/Mo/Cu Heat Sinks (CMC), Torrey Hills Technologies, LLC, [retrieved on Nov. 30, 2023]. Retrieved from Internet <URL: https://www.torreyhillstech.com/hscmc.html >.*
"Office Action of Japan Counterpart Application", issued on Dec. 19, 2023, with English translation thereof, p. 1-p. 9.

* cited by examiner

LIGHT-EMITTING DEVICE, OPTICAL DEVICE, AND INFORMATION PROCESSING APPARATUS

CROSS-REFERENCE TO RELATED APPLICATIONS

This application is based on and claims priority under 35 USC 119 from Japanese Patent Application No. 2020-030593 filed Feb. 26, 2020

BACKGROUND

(i) Technical Field

The present disclosure relates to a light-emitting device, an optical device, and an information processing apparatus.

(ii) Related Art

Japanese Unexamined Patent Application Publication No. 2008-252129 describes a light-emitting device including a ceramic substrate having light transmission properties, a light-emitting element mounted on a surface of the ceramic substrate, a wiring pattern for supplying power to the light-emitting element, and a metallization layer made of a metal having light reflectivity, the metallization layer being provided in the ceramic substrate so as to reflect light emitted from the light-emitting element.

SUMMARY

Aspects of non-limiting embodiments of the present disclosure relate to a light-emitting device etc. in which a light-emitting element is provided on a front surface side of a heat releasing base member and that has a structure easily allowing heat of the light-emitting element to be released to an outside from a rear surface side of the heat releasing base member in a case where the light-emitting element is low-side-driven, as compared with a structure in which only a wire connected to a cathode electrode and a wire connected to an anode electrode of the light-emitting element are provided on the rear surface side of the heat releasing base member.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting device including an insulating base member having thermal conductivity of 10 W/m·K or more; a light-emitting element provided on a front surface side of the base member; a first rear surface wire that is provided on a rear surface side of the base member and is connected to one of a cathode electrode and an anode electrode of the light-emitting element; a second rear surface wire that is provided on the rear surface side of the base member and is connected to the other one of the cathode electrode and the anode electrode; and a reference potential wire that is provided on the rear surface side of the base member and is connected to an external reference potential.

BRIEF DESCRIPTION OF THE DRAWINGS

Exemplary embodiments of the present disclosure will be described in detail based on the following figures, wherein:

FIG. 5A is a plan view, and FIG. 5B is a cross-sectional view taken along line VB-VB of FIG. 5A;

FIG. 7A is a plan view, and FIG. 7B is a cross-sectional view taken along line VIIB-VIIB of FIG. 7A;

FIG. 8A illustrates wires provided on the wiring substrate, FIG. 8B illustrates wires provided on a front surface side of the heat releasing base member, and FIG. 8C illustrates wires provided on a rear surface side of the heat releasing base member;

FIG. 10A is a plan view, and FIG. 10B is a cross-sectional view taken along line XB-XB of FIG. 10A;

FIG. 11A illustrates wires provided on the wiring substrate, FIG. 11B illustrates wires provided on a front surface side of the heat releasing base member, and FIG. 11C illustrates wires provided on a rear surface side of the heat releasing base member;

FIG. 13A is a plan view, and FIG. 13B is a cross-sectional view taken along line XIIIB-XIIIB of FIG. 13A;

FIG. 14A illustrates wires provided on the wiring substrate, FIG. 14B illustrates wires provided on a front surface side of the heat releasing base member, and FIG. 14C illustrates wires provided on a rear surface side of the heat releasing base member.

DETAILED DESCRIPTION

Exemplary embodiments of the present disclosure are described in detail below with reference to the attached drawings.

An information processing apparatus is often configured to determine whether or not a user who accessed the information processing apparatus has access permission and, only in a case where the user is authenticated as having access permission, permit the user to use the information processing apparatus. Conventional methods for authenticating a user use, for example, a password, a fingerprint, and an iris. Recently, there are demands for an authentication method of higher security. One example of such a method is an authentication method using a three-dimensional image such as an image of a shape of a user's face.

In the following description, it is, for example, assumed that the information processing apparatus is a mobile information processing terminal and a user is authenticated through recognition of a shape of a face captured as a three-dimensional image. Note that the information processing apparatus may be an information processing apparatus of other kinds such as a personal computer (PC).

Furthermore, configurations, functions, methods, and the like described in the exemplary embodiments below can be applied to recognition of a three-dimensional image of an object other than a face, that is, can be applied to recognition of a three-dimensional image acquired from a shape of an object other than a face. Hereinafter, an object from which a three-dimensional image is to be acquired for recognition is referred to as an object to be measured. Examples of the object to be measured include a face. There is no restriction on a distance to the object to be measured.

First Exemplary Embodiment

Information Processing Apparatus 1

Figure 1:
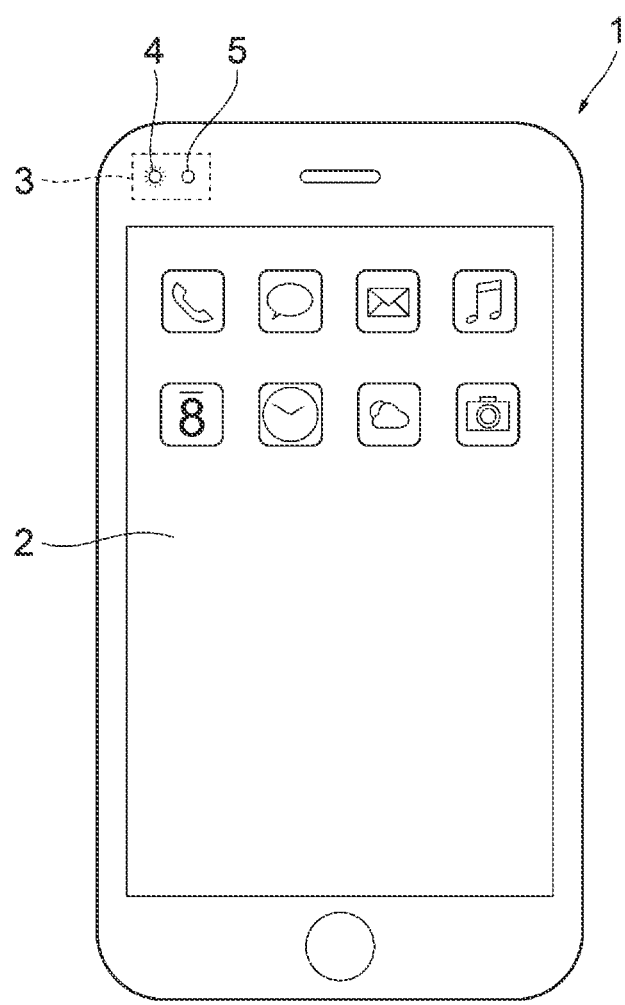
FIG. 1 illustrates an example of an information processing apparatus.

FIG. 1 illustrates an example of the information processing apparatus 1. As described above, the information processing apparatus 1 is, for example, a mobile information processing terminal.

The information processing apparatus 1 includes a user interface unit (hereinafter referred to as a UI unit) 2 and an optical device 3 that acquires a three-dimensional image. The UI unit 2 is, for example, a unit in which a display device for displaying information for a user and an input device that receives an instruction concerning information processing from a user are integrated with each other. The display device is, for example, a liquid crystal display or an organic EL display, and the input device is, for example, a touch panel.

The optical device 3 includes a light-emitting device 4 and a three-dimensional sensor (hereinafter referred to as a 3D sensor) 5. The light-emitting device 4 radiates light toward an object to be measured from which a three-dimensional image is to be acquired (toward a face in this example). The 3D sensor 5 acquires light that is emitted by the light-emitting device 4 and is then reflected back by a face. In this example, it is assumed that the 3D sensor 5 acquires a three-dimensional image of the face according to a Time of Flight method using a flight time of light. As described above, the 3D sensor 5 may acquire a three-dimensional image of an object other than a face. Acquisition of a three-dimensional image may be also referred to as 3D sensing. A three-dimensional image may be also referred to as a three-dimensional shape. Acquisition of a three-dimensional image or acquisition of a three-dimensional shape may be also referred to as measurement of a three-dimensional image or measurement of a three-dimensional shape. The 3D sensor 5 is an example of a light receiving unit.

The information processing apparatus 1 is a computer including a CPU, a ROM, and a RAM. Examples of the ROM include a non-volatile rewritable memory such as a flash memory. Programs and constant numbers accumulated in the ROM are loaded into the RAM, and the CPU executes the programs. The information processing apparatus 1 thus operates and executes various kinds of information processing.

Figure 2:
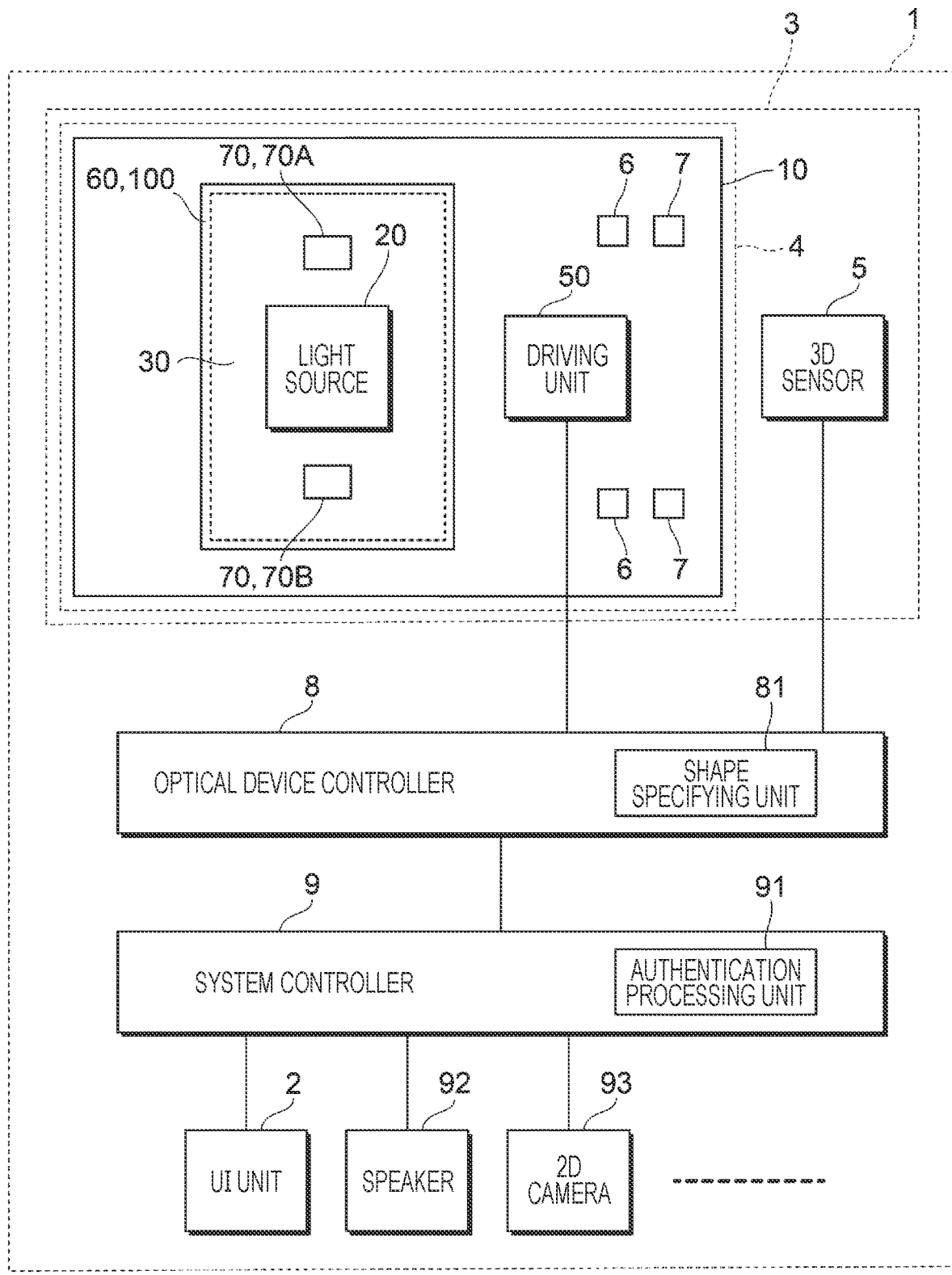
FIG. 2 is a block diagram for explaining a configuration of the information processing apparatus.

FIG. 2 is a block diagram for explaining a configuration of the information processing apparatus 1.

The information processing apparatus 1 includes the optical device 3, an optical device controller 8, and a system controller 9. The optical device controller 8 controls the optical device 3. The optical device controller 8 includes a shape specifying unit 81. The system controller 9 controls the whole information processing apparatus 1 as a system. The system controller 9 includes an authentication processing unit 91. The system controller 9 is connected to the UI unit 2, a speaker 92, and a two-dimensional camera (referred to as a 2D camera in FIG. 2) 93. These members are described below in order.

The light-emitting device 4 of the optical device 3 includes a wiring substrate 10, a heat releasing base member 100, a light source 20, a light diffusing member 30, a driving unit 50, a holding unit 60, and a capacitor 70. Furthermore, the light-emitting device 4 includes passive elements such as a resistive element 6 and a capacitor 7 so that the driving unit 50 operates. In FIG. 2, two capacitors 70 are illustrated. The two capacitors 70 are referred to as capacitors 70A and 70B. In a case where the capacitors 70A and 70B are not distinguished from each other, the capacitors 70A and 70B are referred to as capacitors 70. The heat releasing base member 100 is an example of a base member.

The number of capacitors 70 may be 1 or may be 2 or more. Furthermore, the number of resistive elements 6 and the number of capacitors 7 may be 1 or may be 2 or more. In the following description, electric components such as the 3D sensor 5, the resistive elements 6, and the capacitors 7 other than the light source 20, the driving unit 50, and the capacitors 70 are sometimes collectively referred to as circuit components. The capacitor is sometimes referred to as a capacitive element. The capacitors 70 (the capacitors 70A and 70B in this example) are an example of a capacitive element.

The heat releasing base member 100, the driving unit 50, the capacitors 70A and 70B, the resistive elements 6, and the capacitors 7 of the light-emitting device 4 are provided on a front surface side of the wiring substrate 10. The 3D sensor 5 may be provided on the front surface of the wiring substrate 10. The light source 20, the capacitors 70A and 70B, and the holding unit 60 are provided on a front surface of the heat releasing base member 100. The light diffusing member 30 is provided on the holding unit 60. In this example, an external shape of the heat releasing base member 100 is identical to an external shape of the light diffusing member 30. These configurations will be described in detail with reference to FIGS. 7 through 9, which will be described later. The "front surface" as used herein refers to a front side of the paper on which FIG. 2 is drawn. More specifically, a side of the wiring substrate 10 on which the heat releasing base member 100 is provided is referred to as a front surface, a front side, or a front surface side. Furthermore, a side of the heat releasing base member 100 on which the light source 20 is provided is referred to as a front surface, a front side, or a front surface side.

The light source 20 is a light-emitting element array including plural light-emitting elements that are two-dimensionally arranged (see FIG. 3, which will be described later). The light-emitting elements are, for example, vertical cavity surface emitting lasers (VCSELs). In the following description, it is assumed that the light-emitting elements are vertical cavity surface emitting lasers (VCSELs). The vertical cavity surface emitting lasers (VCSELs) are hereinafter referred to as VCSELs. Since the light source 20 is provided on the front surface of the heat releasing base member 100, the light source 20 emits light in a direction perpendicular to the front surface of the heat releasing base member 100 in a direction departing from the heat releasing base member 100. The plural light-emitting elements of the light source 20 are two-dimensionally arranged as described later, and a surface of the light source 20 from which light is emitted is sometimes referred to as an emission surface.

The light diffusing member 30 is a member that diffuses incident light and outputs the diffused light. The light diffusing member 30 is provided so as to cover the light source 20 and the capacitors 70A and 70B. Specifically, the light diffusing member 30 is provided so as to be spaced apart by a predetermined distance from the light source 20 and the capacitors 70A and 70B provided on the heat releasing base member 100 with the use of the holding unit 60 provided on the front surface of the heat releasing base member 100. Accordingly, light emitted by the light source 20 is diffused by the light diffusing member 30, and the diffused light reaches an object to be measured.

In a case where three-dimensional sensing is performed by using a ToF method, the light source 20 is required to emit, for example, pulsed light (hereinafter referred to as an emitted light pulse) of 100 MHz or more whose rise time is 1 ns or less by the driving unit 50. For example, in a case of face authentication, a distance over which light is radiated is approximately 10 cm to approximately 1 m. A range irradiated with light is approximately 1 m square. Accordingly, the light source 20 is a large-output light source, and therefore it is required that heat generated by the light source 20 be efficiently released. The distance over which light is radiated is referred to as a measurement distance, and the range irradiated with light is referred to as an irradiation range or a measurement range. A plane virtually provided in the irradiation range or the measurement range is referred to as an irradiation plane.

The 3D sensor 5 includes plural light receiving cells. For example, each of the light receiving cells is configured to receive pulsed light (hereinafter referred to as a received pulse) that is an emitted pulse from the light source 20 reflected by an object to be measured and accumulate an electric charge corresponding to a period it takes for the light to be received. The 3D sensor 5 is a device having a CMOS structure in which each light receiving cell includes two gates and electric charge accumulating units corresponding to the two gates. By alternately applying a pulse to the two gates, a generated photoelectron is transferred to any of the two electric charge accumulating units at a high speed. In the two electric charge accumulating units, an electric charge according to a phase difference between an emitted light pulse and a received pulse is accumulated. The 3D sensor 5 outputs, for each light receiving cell as a signal, a digital value according to a phase difference between an emitted light pulse and a received pulse through an AD converter. That is, the 3D sensor 5 outputs a signal corresponding to a period from emission of light from the light source 20 to reception of the light by the 3D sensor 5. The AD converter may be provided in the 3D sensor 5 or may be provided outside the 3D sensor 5.

The shape specifying unit 81 of the optical device controller 8 acquires a digital value obtained for each light receiving cell from the 3D sensor 5 and calculates a distance to the object to be measured for each light receiving cell in a case where the 3D sensor 5 is, for example, a device having a CMOS structure as described above. Then, the shape specifying unit 81 specifies a three-dimensional image of the object to be measured based on the calculated distance and outputs the specified three-dimensional image.

The authentication processing unit 91 of the system controller 9 performs authentication processing concerning use of the information processing apparatus 1 in a case where the three-dimensional image of the object to be measured specified by the shape specifying unit 81 matches a three-dimensional image accumulated in advance, for example, in the ROM. Note that the authentication processing concerning use of the information processing apparatus 1 is, for example, processing for determining whether or not to permit use of the information processing apparatus 1. For example, in a case where it is determined that the three-dimensional image of the object to be measured matches a three-dimensional image of a face stored in a storage member such as the ROM, use of the information processing apparatus 1 including various applications offered by the information processing apparatus 1 is permitted.

The shape specifying unit 81 and the authentication processing unit 91 are, for example, realized by a program. Alternatively, the shape specifying unit 81 and the authentication processing unit 91 may be realized by an integrated circuit such as an ASIC or an FPGA. Alternatively, the shape specifying unit 81 and the authentication processing unit 91 may be realized by software such as a program and an integrated circuit such as an ASIC.

As described above, in the case of face authentication, the light source 20 is required to radiate light over a distance ranging from approximately 10 cm to approximately 1 m in an irradiation range of approximately 1 m square. Light reflected by the object to be measured is received by the 3D sensor 5, and thus a three-dimensional image of the object to be measured is measured. Accordingly, the light source 20 is required to be a large-output light source. Therefore, heat needs to be efficiently released from the light source 20.

Although the optical device 3, the optical device controller 8, and the system controller 9 are separately illustrated in FIG. 2, the system controller 9 may include the optical device controller 8. Alternatively, the optical device controller 8 may be included in the optical device 3. Alternatively, the optical device 3, the optical device controller 8, and the system controller 9 may be integral with each other.

Next, the light source 20, the light diffusing member 30, the driving unit 50, and the capacitors 70A and 70B that constitute the light-emitting device 4 are described.

Configuration of Light Source 20

Figure 3:
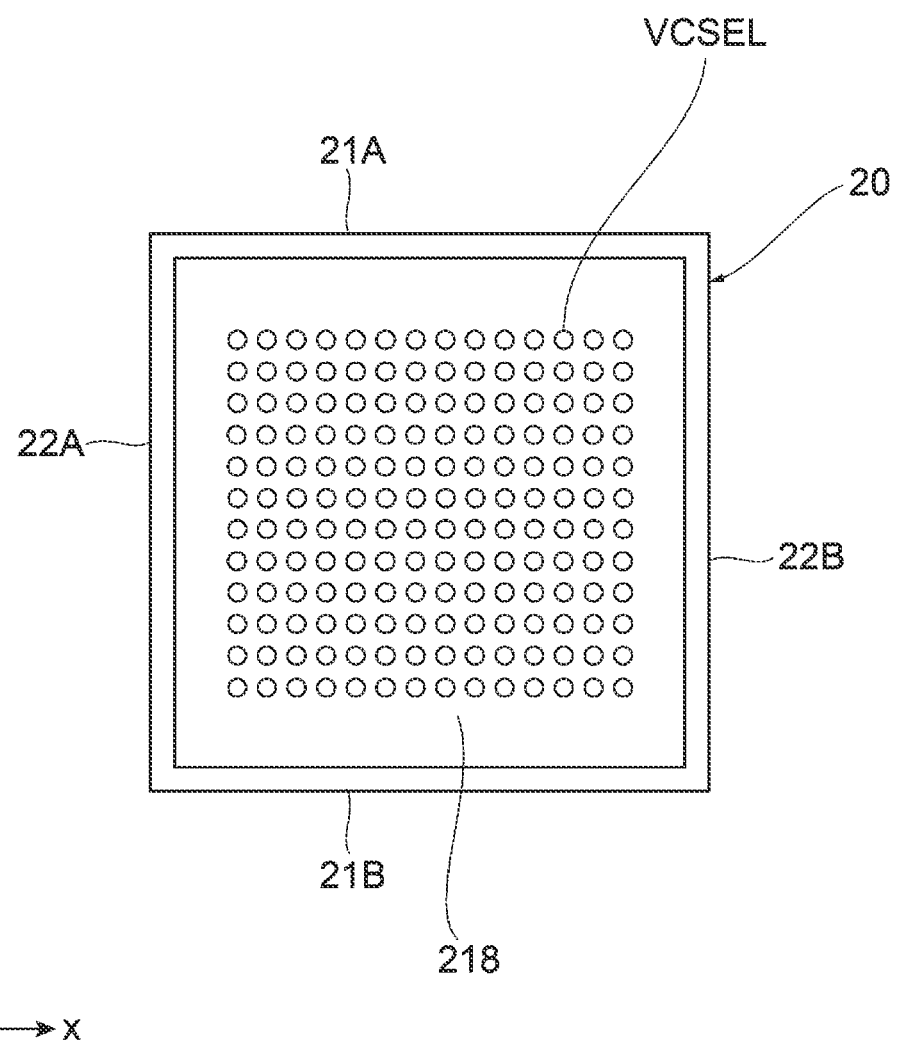
FIG. 3 is a plan view of a light source.

FIG. 3 is a plan view of the light source 20. The light source 20 includes plural VCSELs that are arranged in a two-dimensional array. That is, the light source 20 is a light-emitting element array including VCSELs as light-emitting elements. It is assumed that the rightward direction and the upward direction of the paper on which FIG. 3 is drawn are an x direction and a y direction, respectively. A direction orthogonal to the x direction and the y direction in anticlockwise direction is a z direction. Note that the front surface of the light source 20 is a front side of the paper on which FIG. 3 is drawn, that is, a surface on a +z direction side, and a rear surface of the light source 20 is a rear side of the paper on which FIG. 3 is drawn, that is, a surface on a −z direction side. The plan view of the light source 20 is a view illustrating the light source 20 from the front surface side. More specifically, a side of the light source 20 on which an epitaxial layer functioning as a light emission layer (an active region 206, which will be described later) is provided is referred to as a front surface, a front side, or a front surface side of the light source 20.

Each of the VCSELs is a light-emitting element configured such that an active region that serves as a light-emitting region is provided between a lower multilayer film reflector and an upper multilayer film reflector stacked on a semiconductor substrate 200 (see FIG. 4, which will be described later) and emits laser light in a direction perpendicular to a surface of the semiconductor substrate 200. It is therefore easier to arrange the VCSELs in a two-dimensional array than in a case where end-surface emission type lasers are used. The number of VCSELs included in the light source 20 is, for example, 100 to 1000. The plural VCSELs are connected in parallel and are driven in parallel. The number of VCSELs described above is an example and need just be set in accordance with the measurement distance and the measurement range.

An anode electrode 218 (see FIG. 4, which will be described later) common to the plural VCSELs is provided on the front surface of the light source 20. A cathode electrode 214 is provided on a rear surface of the light source 20 (see FIG. 4, which will be described later). That is, the plural VCSELs are connected in parallel. In a case where the plural VCSELs are connected in parallel and driven in parallel, an object to be measured is irradiated with light of a higher intensity than in a case where the VCSELs are individually driven.

In this example, it is assumed that a shape (hereinafter sometimes referred to as a planar shape) of the light source 20 viewed from the front surface side is a quadrangle. A side surface on a +y direction side is referred to as a side surface 21A, a side surface on a −y direction side is referred to as a side surface 21B, a side surface on a −x direction side is referred to as a side surface 22A, and a side surface on a +x direction side is referred to as a side surface 22B. The side surface 21A and the side surface 21B face each other. The side surface 22A and the side surface 22B connect the side surface 21A and the side surface 21B and face each other.

Structure of VCSEL

Figure 4:
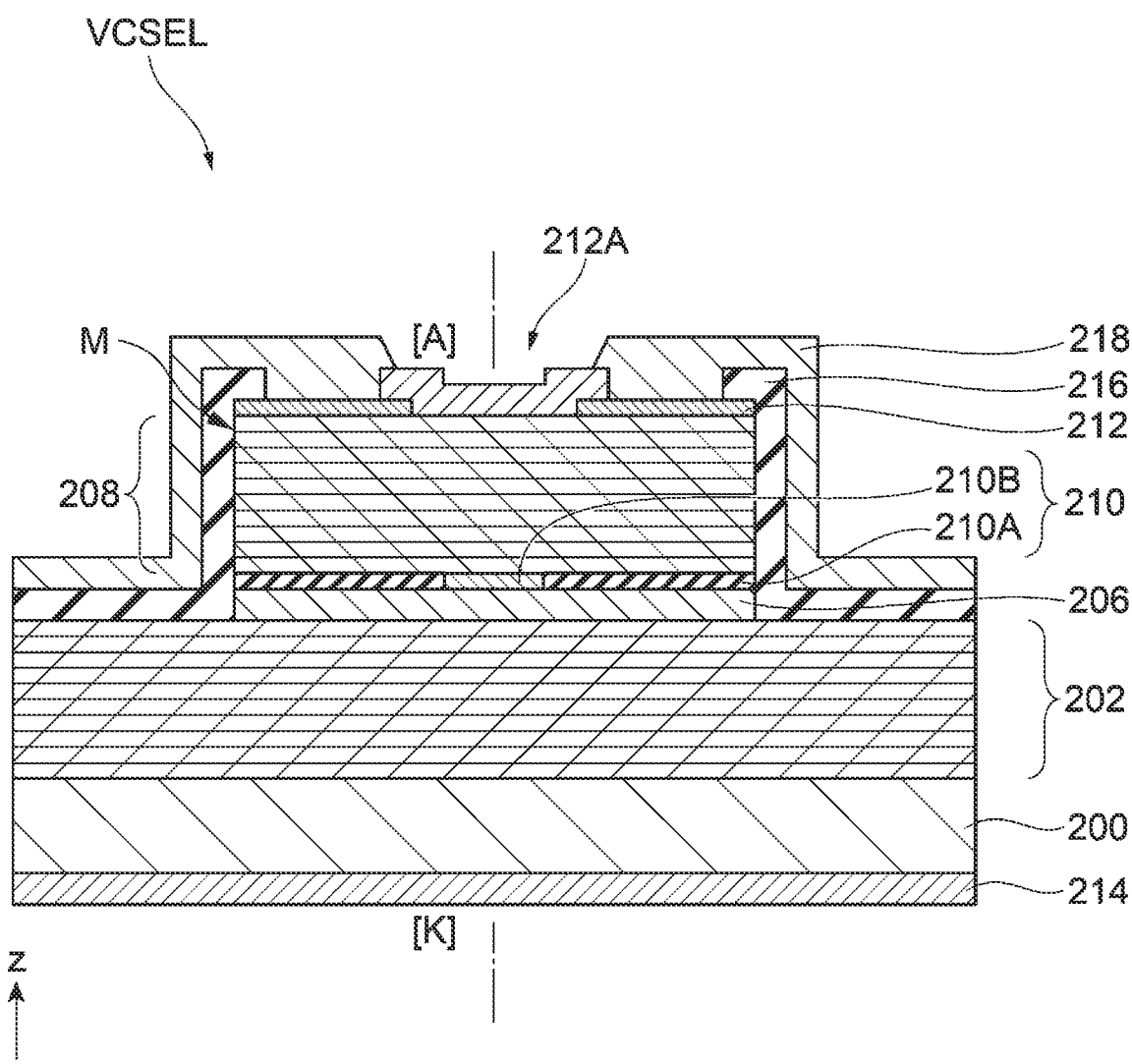
FIG. 4 is a view for explaining a cross-sectional structure of a single VCSEL of the light source.

FIG. 4 is a view for explaining a cross-section structure of a single VCSEL in the light source 20. The VCSEL is a VCSEL having a λ resonator structure. The upward direction of the paper on which FIG. 4 is drawn is the z direction, and a +z direction is referred to as an upper side, and a −z direction is referred to as a lower side.

The VCSEL is configured such that an n-type lower distributed bragg reflector (DBR) 202 in which AlGaAs layers having different Al compositions are alternately stacked, an active region 206 including a quantum well layer sandwiched between an upper spacer layer and a lower spacer layer, and a p-type upper distributed bragg reflector 208 in which AlGaAs layers having different Al compositions are alternately stacked are stacked in order on the semiconductor substrate 200 such as n-type GaAs. Hereinafter, a distributed bragg reflector is referred to as a DBR.

The n-type lower DBR 202 is a multilayer body including pairs of an $Al_{0.9}Ga_{0.1}As$ layer and an GaAs layer, each of the layers has a thickness of $\lambda/4n_r$ ($\lambda$ is an oscillation wavelength, and $n_r$ is a refractive index of a medium), and 40 pairs of these layers are stacked so that these layers are alternately provided. The n-type lower DBR 202 is doped with silicon, which is an n-type impurity, as a carrier. A carrier concentration, is, for example, $3\times10^{18}$ cm$^{-3}$.

The active region 206 is configured such that the lower spacer layer, the quantum well active layer, and the upper spacer layer are stacked. For example, the lower spacer layer is an undoped $Al_{0.6}Ga_{0.4}As$ layer, the quantum well active layer is an undoped InGaAs quantum well layer and an undoped GaAs barrier layer, and the upper spacer layer is an undoped $Al_{0.6}Ga_{0.4}As$ layer.

The p-type upper DBR 208 is a multilayer body including pairs of a p-type $Al_{0.9}Ga_{0.1}As$ layer and a GaAs layer. Each of the layers of the p-type upper DBR 208 has a thickness of $\lambda/4n_r$, and 29 pairs of these layers are stacked so that these layers are alternately provided. The p-type upper DBR 208 is doped with carbon, which is a p-type impurity, as a carrier. A carrier concentration is, for example, $3\times10^{18}$ cm$^{-3}$. Desirably, a contact layer made of p-type GaAs is formed in a topmost layer of the upper DBR 208, and a p-type AlAs current confinement layer 210 is formed in a lowermost layer of the upper DBR 208 or in an inner part of the upper DBR 208.

By etching a semiconductor layer stacked from the upper DBR 208 to the lower DBR 202, a cylindrical mesa M is formed on the semiconductor substrate 200. This causes the current confinement layer 210 to be exposed on a side surface of the mesa M. An oxidized region 210A oxidized from the side surface of the mesa M and an electrically-conductive region 210B surrounded by the oxidized region 210A are formed in the current confinement layer 210 by an oxidation process. In the oxidation process, an oxidation speed of the AlAs layer is higher than an oxidation speed of the AlGaAs layer, and the oxidized region 210A is oxidized from the side surface of the mesa M toward an inside of the mesa M at an almost constant speed, and therefore a cross-sectional shape of the electrically-conductive region 210B becomes a shape reflecting an external shape of the mesa M, i.e., a circular shape, and a center of the shape almost matches an axis (indicated by the line with alternate long and short dashes) of the mesa M. In the present exemplary embodiment, the mesa M has a columnar structure.

An annular p-side electrode 212 made of a metal in which Ti/Au and the like are stacked is formed in a topmost layer of the mesa M. The p-side electrode 212 makes ohmic-contact with the contact layer provided in the upper DBR 208. An inner side of the annular p-side electrode 212 serves as a light outlet 212A through which laser light is emitted to an outside. That is, the VCSEL emits light in a direction perpendicular to a front surface (a surface on the +z direction side) of the semiconductor substrate 200. The axis of the mesa M is an optical axis. Furthermore, the cathode electrode 214 is formed as an n-side electrode on the rear surface of the semiconductor substrate 200. Note that a front surface (a surface on the +z direction side) of the upper DBR 208 on an inner side of the p-side electrode 212 is a light emission surface. That is, an optical axis direction of the VCSEL is a light emission direction.

An insulating layer 216 is provided so as to cover the front surface of the mesa M excluding a part of the p-side electrode 212 to which the anode electrode 218 is connected and the light outlet 212A. The anode electrode 218 is provided so as to make ohmic-contact with the p-side electrode 212 excluding the light outlet 212A. The anode electrode 218 is provided common to the plural VCSELs. That is, the p-side electrodes 212 of the plural VCSELs that constitute the light source 20 are connected in parallel by the anode electrode 218.

In FIG. 4, the anode electrode 218 is indicated by [A] indicative of an anode, and the cathode electrode 214 is indicated by [K] indicative of a cathode.

The VCSEL may oscillate in a single transverse mode or may oscillate in a multiple transverse mode. Light output of a single VCSEL is, for example, 4 mW to 8 mW. Accordingly, for example, in a case where the light source 20 is constituted by 500 VCSELs, light output of the light source 20 is 2 W to 4 W. Heat generated by such a large-output light source 20 is large. Therefore, it is required that heat be released efficiently and sufficiently from the light source 20.

Configuration of Light Diffusing Member 30

Figure 5A:
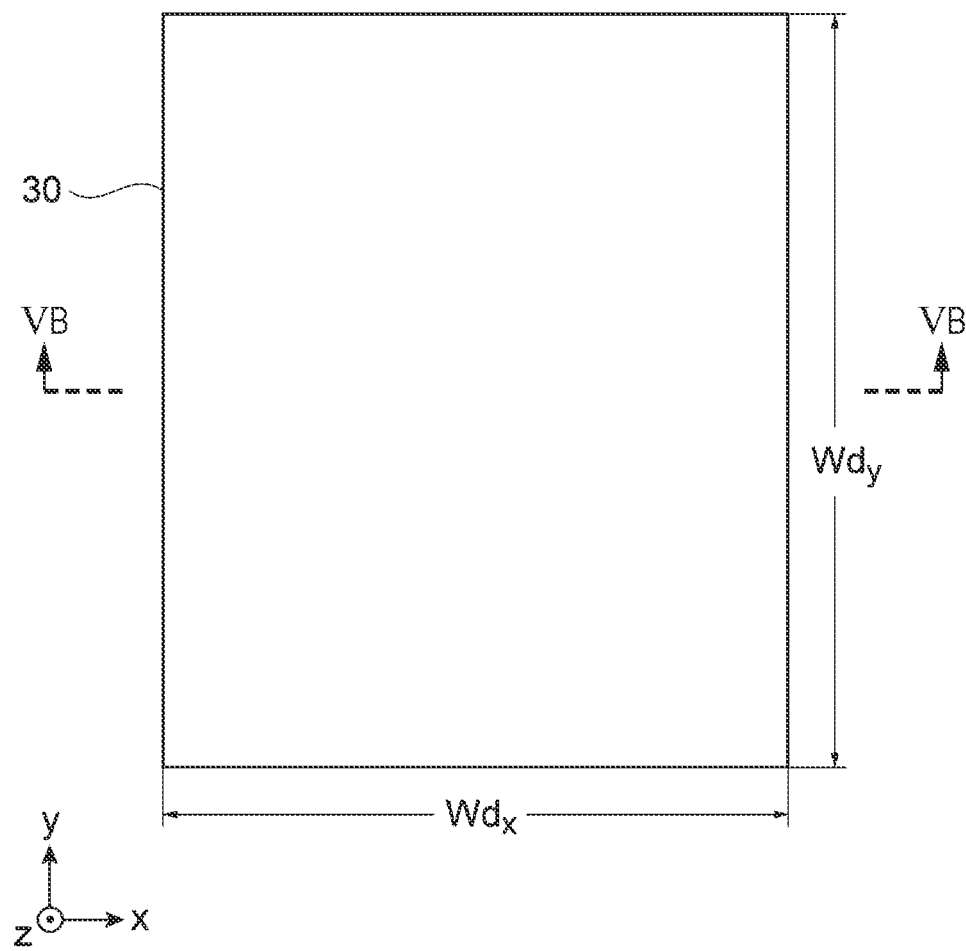
FIGS. 5A and 5B are views for explaining an example of a light diffusing member.
Figure 5B:
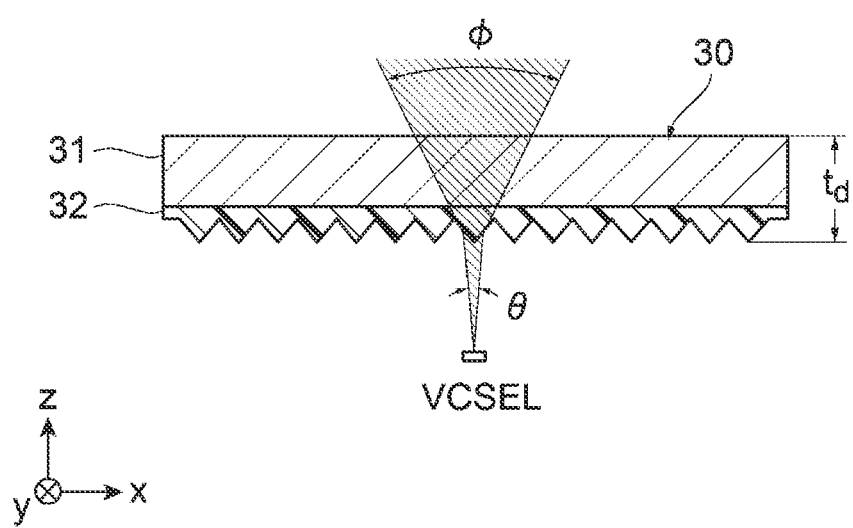

FIGS. 5A and 5B are views for explaining an example of the light diffusing member 30. FIG. 5A is a plan view, and FIG. 5B is a cross-sectional view taken along line VB-VB of FIG. 5A. In FIG. 5A, it is assumed that the rightward direction and the upward direction of the paper on which FIG. 5A is drawn are the x direction and the y direction, respectively. It is assumed that a direction orthogonal to the x direction and the y direction in anticlockwise direction is the z direction. A surface of the light diffusing member 30 on the +z direction side is referred to as a front surface or a front surface side, and a surface of the light diffusing member 30 on the −z direction side is referred to as a rear surface or a rear surface side. Accordingly, in FIG. 5B, the rightward direction, the depth direction, and the upward direction of the paper on which FIG. 5B is drawn are the x direction, the y direction, and the z direction, respectively.

As illustrated in FIG. 5B, the light diffusing member 30 includes a resin layer 32 having irregularities for diffusing light, for example, on a rear surface (−z direction) side of a glass substrate 31 whose both surfaces are parallel and flat. The light diffusing member 30 widens a spread angle of light incident from the VCSELs of the light source 20. That is, the irregularities of the resin layer 32 of the light diffusing member 30 refract and scatter light so that incident light is output as light having a wider spread angle. That is, as illustrated in FIG. 5B, the light diffusing member 30 causes light having a spread angle θ emitted from the VCSELs and incident from the rear surface (−z direction side) to be output as light having a spread angle φ, which is larger than θ, from the front surface (+z direction side) (θ<φ). This means that use of the light diffusing member 30 increases an area of an irradiation surface irradiated with light emitted from the light source 20 as compared with a case where the light diffusing member 30 is not used. The spread angles θ and φ are full width at half maximum (FWHM).

The light diffusing member 30 is, for example, configured such that a planar shape thereof is a quadrangle, a width $Wd_x$ thereof in the x direction and a width $Wd_y$ thereof in the y direction are 1 mm to 30 mm, and a thickness $t_d$ thereof in the z direction is 0.1 mm to 1 mm. In a case where the light diffusing member 30 has the size and shape described above, the light diffusing member 30 is suitable especially for face authentication of a mobile information processing terminal and measurement of a three-dimensional image of an object to be measured within a relatively close range up to approximately several meters. The planar shape of the light diffusing member 30 may be any of other shapes such as a polygonal shape or a circular shape.

Driving Unit 50 and Capacitors 70A and 70B

In a case where the light source 20 is driven at a higher speed, the light source 20 is desirably driven by low-side driving. The low-side driving refers to a configuration in which a driving element such as an MOS transistor is located on a downstream side of a current path relative to a target to be driven such as a VCSEL. Conversely, a configuration in which a driving element is located on an upstream side is referred to as high-side driving.

Figure 6:
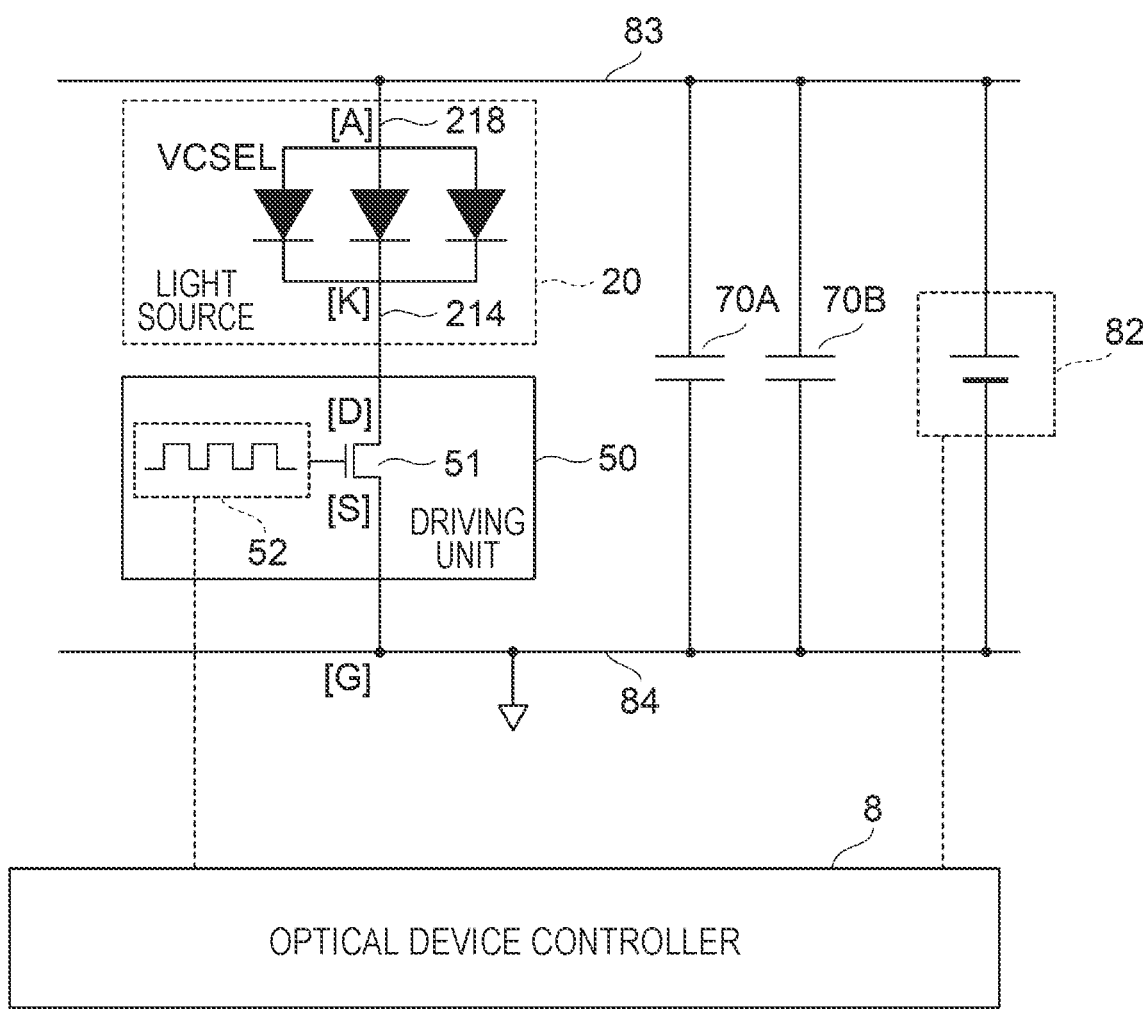
FIG. 6 illustrates an example of an equivalent circuit in a case where the light source is low-side driven.

FIG. 6 illustrates an example of an equivalent circuit that drives the light source 20 by low-side driving. FIG. 6 illustrates VCSELs of the light source 20, the driving unit 50, the capacitors 70A and 70B, and a power source 82. The power source 82 is provided in the optical device controller 8 illustrated in FIG. 2. The power source 82 generates a direct-current voltage whose + side is a power source potential and whose − side is a reference potential. The power source potential is supplied to a power source line 83, and the reference potential is supplied to a reference line 84. The reference potential may be a ground potential (also referred to as GND; indicated by "G" in FIG. 6).

The light source 20 is constituted by plural VCSELs that are connected in parallel as described above. The anode electrode 218 (see FIG. 4; indicated by [A] in FIG. 6) of the VCSELs is connected to the power source line 83.

The driving unit 50 includes an n-channel MOS transistor 51 and a signal generating circuit 52 that turns the MOS transistor 51 on an off. A drain (indicated by [D] in FIG. 6) of the MOS transistor 51 is connected to the cathode electrode 214 (see FIG. 4; indicated by [K] in FIG. 6)) of the VCSELs. A source (indicated by [S] in FIG. 6) of the MOS transistor 51 is connected to the reference line 84. A gate of the MOS transistor 51 is connected to the signal generating circuit 52. That is, the VCSELs and the MOS transistor 51 of the driving unit 50 are connected in series between the power source line 83 and the reference line 84. The signal generating circuit 52 generates an "H level" signal that turns the MOS transistor 51 on and an "L level" signal that turns the MOS transistor 51 off under control of the optical device controller 8.

One terminal of the capacitor 70A and one terminal of the capacitor 70B are connected to the power source line 83, and the other terminal of the capacitor 70A and the other terminal of the capacitor 70B are connected to the reference line 84. In a case where plural capacitors 70 are provided, the plural capacitors 70 are connected in parallel. In FIG. 6, the capacitors 70 are the two capacitors 70A and 70B. Note that the capacitors 70 are, for example, electrolytic capacitors or ceramic capacitors.

Next, a driving method for driving the light source 20 that is low-side driving is described.

First, it is assumed that a signal generated by the signal generating circuit 52 of the driving unit 50 is an "L level". In this case, the MOS transistor 51 is in an off state. That is, no electric current flows between the source (indicated by [S] in FIG. 6) and the drain (indicated by [D] in FIG. 6) of the MOS transistor 51. Accordingly, no electric current flows through the VCSELs that are connected in series with the MOS transistor 51. That is, the VCSELs do not emit light.

In this state, the capacitors 70A and 70B are connected to the power source 82, the one terminal of the capacitor 70A and the one terminal of the capacitor 70B that are connected to the power source line 83 become a power source potential, and the other terminal of the capacitor 70A and the other terminal of the capacitor 70B that are connected to the reference line 84 become a reference potential. Accordingly, the capacitors 70A and 70B are charged with an electric charge supplied from the power source 82.

Next, when the signal generated by the signal generating circuit 52 of the driving unit 50 becomes an "H level", the MOS transistor 51 shifts from an off state to an on state. As a result, the capacitors 70A and 70B, and the MOS transistor 51 and the VCSELs that are connected in series constitute a closed loop. This causes the electric charge accumulated in the capacitors 70A and 70B to be supplied to the MOS transistor 51 and the VCSELs that are connected in series. That is, an electric current flows through the VCSELs, and the VCSELs emit light.

Then, when the signal generated by the signal generating circuit 52 of the driving unit 50 becomes an "L level" again, the MOS transistor 51 shifts from an on state to an off state. This opens the closed loop of the capacitors 70A and 70B, and the MOS transistor 51 and the VCSELs that are connected in series. As a result, an electric current does not flow through the VCSELs. Accordingly, the VCSELs stop light emission. The capacitors 70A and 70B are charged with an electric charge supplied from the power source 82.

As described above, when the signal output by the signal generating circuit 52 repeatedly switches between the "L level" and the "H level", the MOS transistor 51 repeatedly turns on and off, and the VCSELs repeatedly switch between non-light-emission and light emission. The repeated on and off of the MOS transistor 51 is sometimes referred to as switching.

As described above, by discharging the electric charges accumulated in the capacitors 70A and 70B at once and supplying the electric charges to the VCSELs when the MOS transistor 51 shifts from an off state to an on state, the VCSELs are caused to emit light in a short rise time (e.g., 1 ns or less). After the light emission of the VCSELs is stopped, a longer time than the rise time may be taken from the power source 82 to the capacitors 70A and 70B. Although an electric charge (electric current) may be directly supplied from the power source 82 to the VCSELs without the capacitors 70, this undesirably makes the rise time of light emission of the VCSELs longer. That is, the rise time of light emission of the VCSELs is shortened by supplying an electric current to the VCSELs at once according to low-side driving using the capacitors 70A and 70B. To shorten the rise time of light emission of the VCSELs, inductance (hereinafter referred to as circuit inductance) of the closed loop constituted by the capacitors 70A and 70B, and the MOS transistor 51 and the VCSELs that are connected in series is desirably small. Large circuit inductance causes delay in flow of an electric charge and thereby prolongs a rise time of light emission of the VCSELs. That is, it is required to reduce the circuit inductance.

Light-Emitting Device 4

Next, the light-emitting device 4 is described in detail.

Figure 7A:
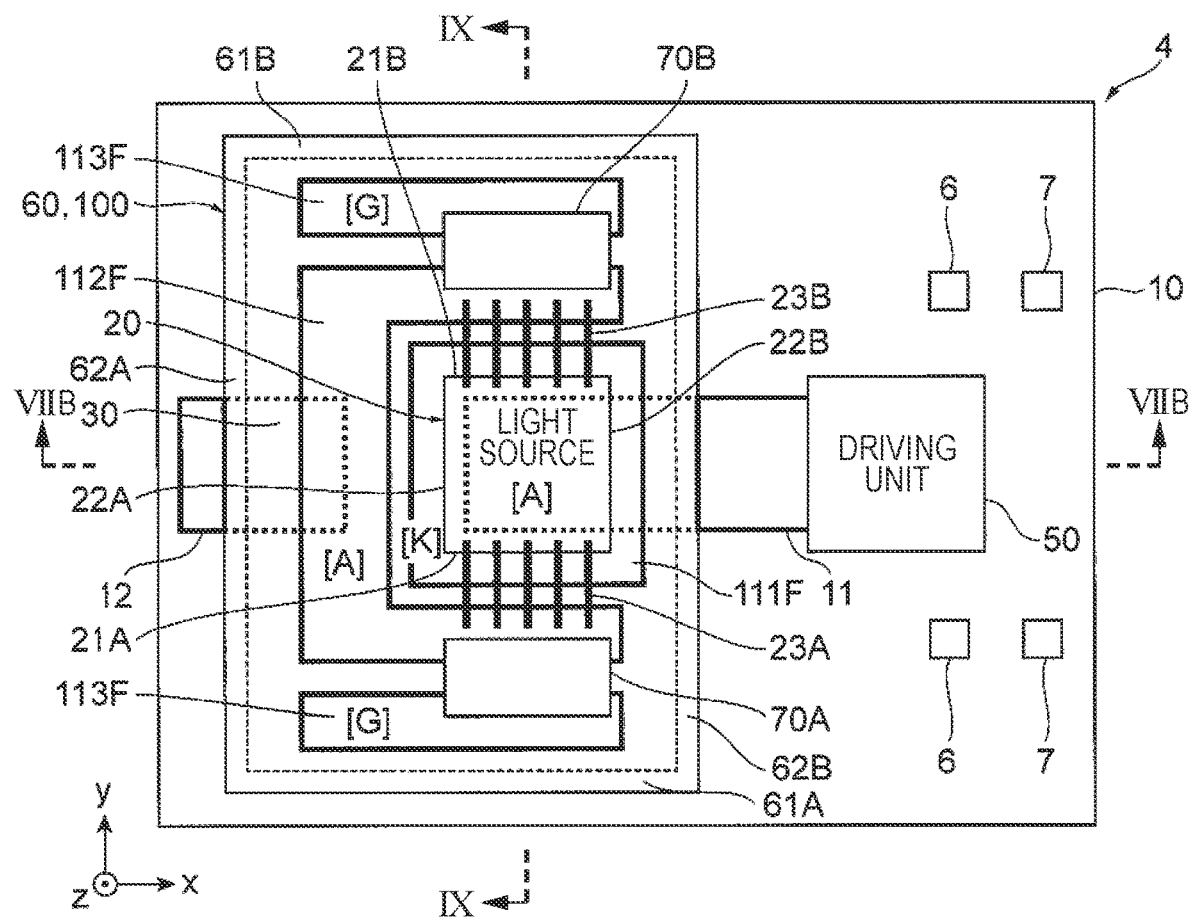
FIGS. 7A and 7B are views for explaining a light-emitting device to which the first exemplary embodiment is applied.
Figure 7B:
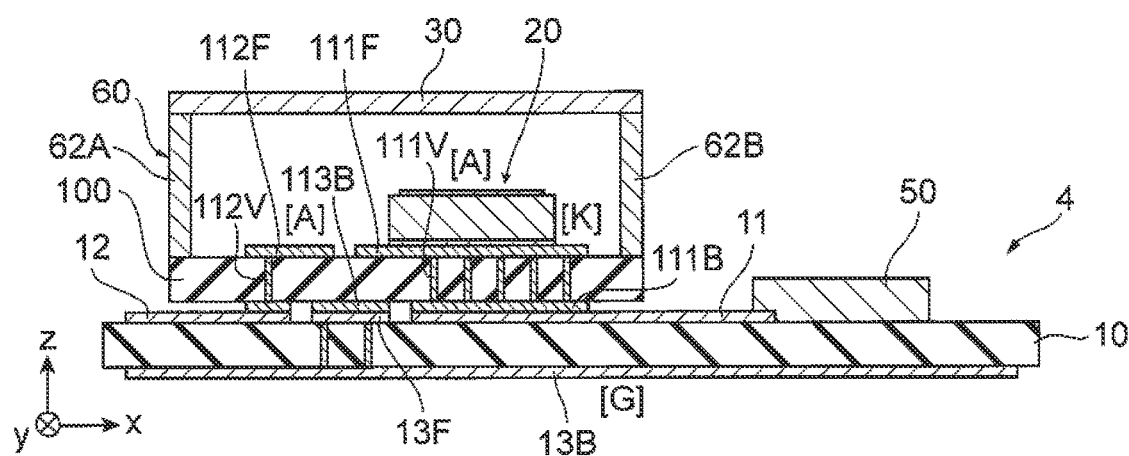

FIGS. 7A and 7B are views for explaining the light-emitting device 4 to which the first exemplary embodiment is applied. FIG. 7A is a plan view, and FIG. 7B is a cross-sectional view taken along line VIIB-VIIB of FIG. 7A. FIG. 7A is a view of the light-emitting device 4 seen through the light diffusing member 30. In FIG. 7A, it is assumed that the rightward direction and the upward direction of the paper on which FIG. 7A is drawn are the x direction and the y direction, respectively. It is assumed that a direction (frontward direction of the paper on which FIG. 7 is drawn) orthogonal to the x direction and the y direction in anticlockwise direction is the z direction. As for the members described below (such as the wiring substrate 10, the heat releasing base member 100, and the light diffusing member 30), a front side (+z direction) of the paper is referred to as a front surface or a front surface side, and a rear side (−z direction) of the paper is referred to as a rear surface or a rear surface side. Seeing through the members from the front surface side is referred to as top view. In FIG. 7B, the rightward direction of the paper is the x direction, the rearward direction of the paper is the y direction, and the upward direction of the paper is the z direction.

As illustrated in FIGS. 7A and 7B, the heat releasing base member 100, the driving unit 50, the resistive elements 6, and the capacitors 7 are provided on the front surface of the wiring substrate 10. The light source 20, the capacitors 70A and 70B, and the holding unit 60 are provided on the front surface of the heat releasing base member 100. The light diffusing member 30 is provided on the holding unit 60. As illustrated in FIG. 7A, in the light-emitting device 4, the heat releasing base member 100 and the driving unit 50 are aligned in the x direction. On the front surface of the heat releasing base member 100, the capacitors 70A and 70B are aligned in the y direction with the light source 20 interposed therebetween.

As illustrated in FIG. 7A, the holding unit 60 includes walls 61A, 61B, 62A, and 62B that are provided so as to surround the light source 20 and the capacitors 70A and 70B. The holding unit 60 holds the light diffusing member 30 by the walls 61A, 61B, 62A, and 62B. That is, the light diffusing member 30 is provided so as to be spaced apart by a predetermined distance from the light source 20 and the capacitors 70A and 70B provided on the heat releasing base member 100 by the holding unit 60. The light diffusing member 30 is provided so as to cover the light source 20 and the capacitors 70A and 70B. Covering the light source 20 with the light diffusing member 30 means that the light diffusing member 30 is provided on an emission path of light emitted by the light source 20 so that the light emitted by the light source 20 passes through the light diffusing member 30. As described later, this state is a state in which the light source 20 and the light diffusing member 30 overlap each other in a case where the light source 20 is seen through the light diffusing member 30 from the front surface side of the light diffusing member 30, that is, in top view. Note that the top view refers to seeing the light source 20 through the light diffusing member 30 from an upper surface side of the light diffusing member 30. The same applies to other cases.

The holding unit 60 is, for example, a member that is molded from a resin material. The holding unit 60 is desirably colored, for example, in black to absorb light emitted from the light source 20. As a result, light emitted toward the holding unit 60 by the light source 20 is absorbed. This keeps the object to be measured from being irradiated with light that has passed through the holding unit 60 and light reflected by the holding unit 60.

It is assumed here that an external shape of the heat releasing base member 100, an external shape of the light diffusing member 30, and an external shape of the holding unit 60 are identical. Accordingly, external edges of the heat releasing base member 100, the light diffusing member 30, and the holding unit 60 overlap. Note that the external edge of the heat releasing base member 100 may be larger than the external edge of the light diffusing member 30 and the external edge of the holding unit 60. Conversely, the external edge of the heat releasing base member 100 may be smaller than the external edge of the light diffusing member 30 and the external edge of the holding unit 60. In this case, the holding unit 60 need just be provided on the front surface of the wiring substrate 10.

The light diffusing member 30 may be provided so as to cover only the light source 20.

The wiring substrate 10 and the heat releasing base member 100 are provided with plural wires on the front surface sides and rear surface sides thereof. The wires will be described later with reference to FIGS. 8A, 8B, 8C, and 9. Note that the wires are a conductive pattern connected to an electric circuit, and a shape thereof is not limited.

As described above, the light source 20 is provided on the front surface of the heat releasing base member 100. The heat releasing base member 100 is provided on the front surface of the wiring substrate 10. This allows heat generated from the light source 20 to be efficiently released. Since a substrate that constitutes the wiring substrate 10 has low thermal conductivity, the light source 20 is provided on the front surface of the heat releasing base member 100 having higher thermal conductivity than the wiring substrate 10, as described below.

The wiring substrate 10 is, for example, configured such that a wiring layer in which wires made of a metal such as a copper (Cu) foil are provided is provided on an insulating base member made of a material such as a glass epoxy resin. It is assumed here that the wiring substrate 10 is a two-layer printed wiring substrate in which a wiring layer is provided on a front surface side and a rear surface side of a base member. One example of such a base member made of a glass epoxy resin is a base member called FR-4. This base member has a thickness of approximately 100 μm and has thermal conductivity of approximately 0.4 W/m·K. Thermal conductivity of copper (Cu) is approximately 360 W/m·K. The thermal conductivity is a value at 25° C. unless otherwise specified. The base member of the wiring substrate 10 is an example of a second base member.

The heat releasing base member 100 is constituted by an insulating base member that has higher thermal conductivity than the wiring substrate 10. For example, the thermal conductivity of the heat releasing base member 100 is preferably 10 W/m·K or more, more preferably 50 W/m·K or more, still more preferably 100 W/m·K or more. A material having thermal conductivity of 10 W/m·K or more is, for example, alumina ($Al_2O_3$) having thermal conductivity of 20 W/m·K to 30 W/m·K. A material having thermal conductivity of 50 W/m·K or more is, for example, silicon nitride ($Si_3N_4$) having thermal conductivity of approximately 85 W/m·K. A material having thermal conductivity of 100 W/m·K or more is, for example, aluminum nitride (AlN) having thermal conductivity of 150 W/m·K to 250 W/m·K. These materials are sometimes referred to as ceramic materials. That is, the whole heat releasing base member 100 is desirably made of a ceramic material. The heat releasing base member 100 may be made of an insulating material of other kinds having high thermal conductivity such as silicon (Si) doped with no impurity. The heat releasing base member 100 is an example of a first base member.

The heat releasing base member 100 has a quadrangular planar shape whose width $Ws_x$ in the x direction and width $Ws_y$ in the y direction are 1 mm to 30 mm (see FIGS. 8A through 8C, which will be described later). The heat releasing base member 100 has a thickness in a range from 100 μm to 500 μm. In this example, the external shape of the heat releasing base member 100 is identical to the external shape of the light diffusing member 30.

Figure 8A:
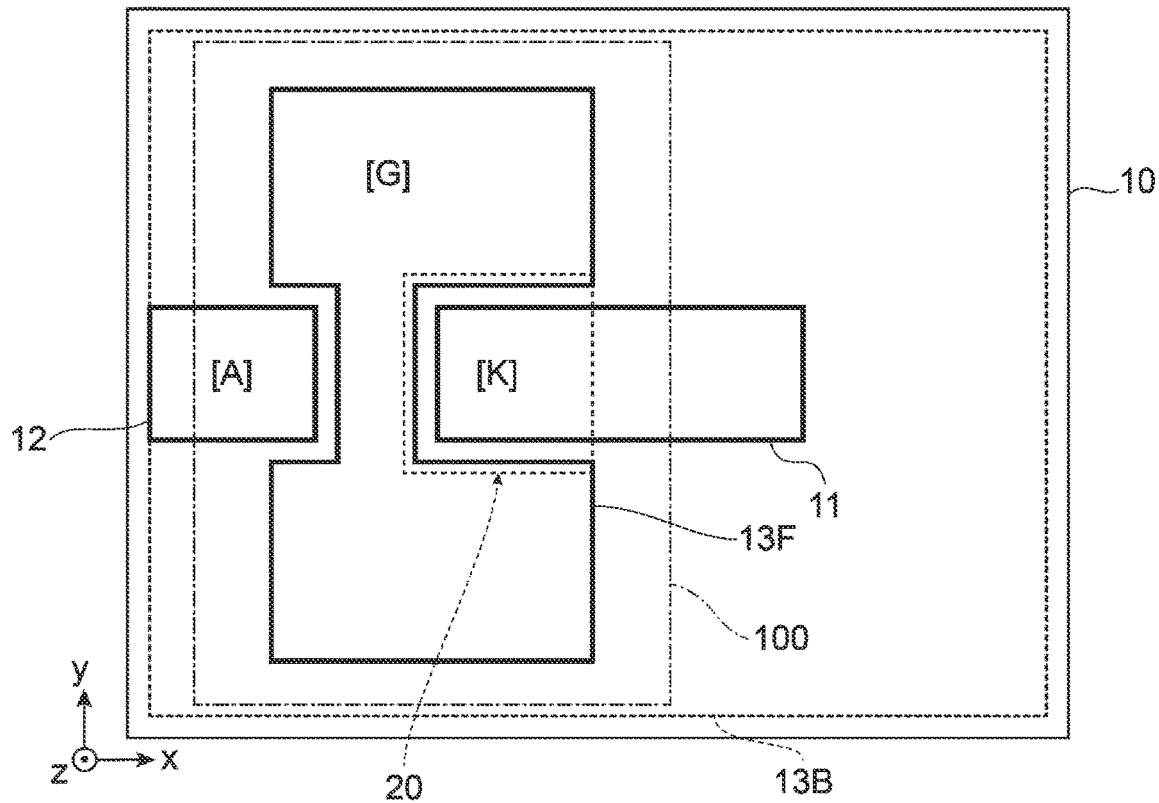
FIGS. 8A through 8C are views for explaining wires provided on the wiring substrate and wires provided on the heat releasing base member.
Figure 8B:
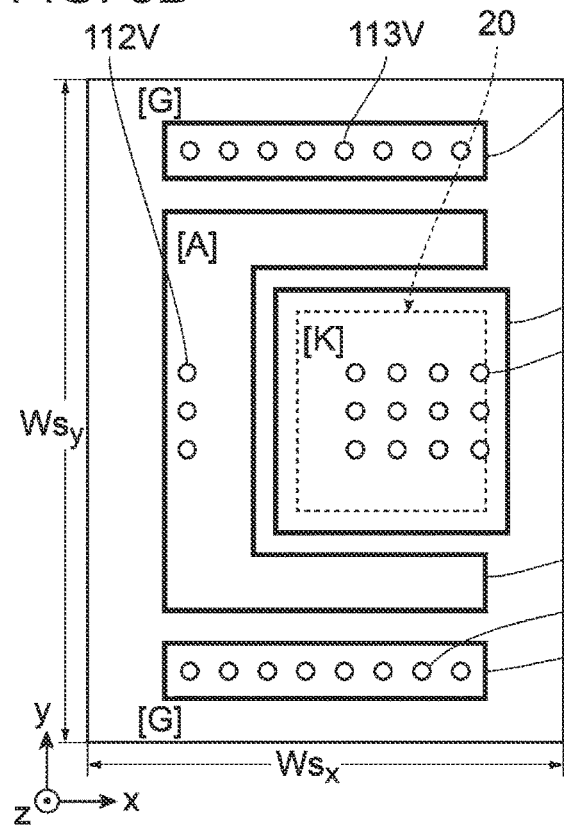
Figure 8C:
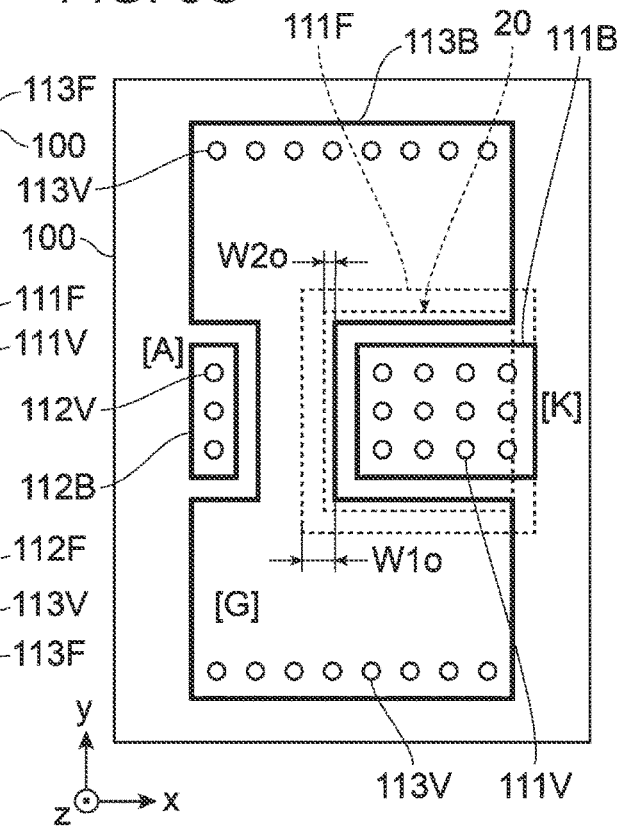

FIGS. 8A through 8C are views for explaining wires provided on the wiring substrate 10 and wires provided on the heat releasing base member 100. FIG. 8A illustrates wires provided on the wiring substrate 10, FIG. 8B illustrates wires provided on the front surface side of the heat releasing base member 100, and FIG. 8C illustrates wires provided on the rear surface side of the heat releasing base member 100. The x, y, and z directions illustrated in FIGS. 8A through 8C are identical to the x, y, and z directions illustrated in FIGS. 7A and 7B. Accordingly, the wires provided on the rear surface side of the heat releasing base member 100 illustrated in FIG. 8C are ones viewed from the front surface side of the heat releasing base member 100, and the wires provided on the front surface of the heat releasing base member 100 illustrated in FIG. 8B and the heat releasing base member 100 are removed in FIG. 8C. In FIGS. 8A through 8C, a part connected to the cathode electrode 214 of the light source 20 is indicated by [K], a part connected to the anode electrode 218 of the light source 20 is indicated by [A], and a part to which the reference potential is supplied is indicated by [G].

First, the wires provided on the wiring substrate 10 illustrated in FIG. 8A are described. In FIG. 8A, the external shape of the heat releasing base member 100 is indicated by the line with alternate long and short dashes.

In FIG. 8A, the wires provided on the front surface side of the wiring substrate 10 are indicated by the solid lines, and the wires provided on the rear surface side of the wiring substrate 10 are indicated by the broken lines. Specifically, a cathode wire 11, and an anode wire 12 and a reference potential wire 13F that are insulated from each other are provided on the front surface side of the wiring substrate 10.

The cathode wire 11 has a rectangular planar shape, and an end thereof on the +x direction side is connected to the driving unit 50, and an end thereof in the −x direction side is connected to the cathode electrode 214 of the light source 20 with the heat releasing base member 100 interposed therebetween (see FIGS. 7A and 7B).

The anode wire 12 has a rectangular planar shape, and an end thereof on the +x direction side is connected to the anode electrode 218 of the light source 20 with the heat releasing base member 100 interposed therebetween, and an end thereof in the −x direction side is connected to the + side of the power source 82. The anode wire 12, the reference potential wire 13F, and the cathode wire 11 are aligned in the x direction. The reference potential wire 13F extends in the ±y directions beyond the cathode wire 11 and the anode wire 12, and extended parts thereof are expanded in the ±x directions.

A reference potential wire 13B is provided on the rear surface side of the wiring substrate 10. The reference potential wire 13F provided on the front surface side of the wiring substrate 10 and the reference potential wire 13B provided on the rear surface of the wiring substrate 10 are electrically connected to each other by an electrically-conductive through conductor 13V (see FIG. 7B). The reference potential is supplied to the reference potential wire 13B provided on the rear surface side. That is, the reference potential is supplied to the reference potential wire 13F provided on the front surface from the reference potential wire 13B provided on the rear surface side. In this example, the reference potential wire 13B is provided on the whole rear surface of the wiring substrate 10. An area of the reference potential wire 13B is set larger than an area of the cathode wire 11 and an area of the anode wire 12. In general, a reference wire provided on the rear surface of the wiring substrate 10 is often provided over a wide area on the rear surface to stabilize a potential of the wire provided on the front surface. In FIG. 8A, illustration of the through conductor 13V is omitted. The through conductor 13V is made of a metal such as copper (Cu) and therefore has high thermal conductivity. The same applies to a through conductor (later described) provided in the heat releasing base member 100. Note that a through conductor is also called a via.

Next, the wires provided on the heat releasing base member 100 illustrated in FIGS. 8B and 8C are described.

As illustrated in FIG. 8B, a cathode wire 111F, an anode wire 112F, and two reference potential wires 113F that are insulated from one another are provided on the front surface side of the heat releasing base member 100. The cathode electrode 214 side of the light source 20 is mounted on a front surface of the cathode wire 111F (see FIG. 7B). The anode wire 112F is provided so as to surround three sides (a −x direction side and ±y direction sides) of the cathode wire 111F. The anode wire 112F is connected to the side surfaces 21A and 21B sides (the ±y direction sides) of the light source 20 by bonding wires 23A and 23B (see FIG. 7A). The two reference potential wires 113F are provided on ±y direction sides of the anode wire 112F. The cathode wire 111F is an example of a first front surface wire, and the anode wire 112F is an example of a second front surface wire.

As illustrated in FIG. 8C, a cathode wire 111B, an anode wire 112B, and a reference potential wire 113B that are insulated from one another are provided on the rear surface side of the heat releasing base member 100. In FIG. 8C, the cathode wire 111F illustrated in FIG. 8B is indicated by the broken line. The cathode wire 111B is an example of a first rear surface wire, the anode wire 112B is an example of a second rear surface wire, and the reference potential wire 113B is an example of a reference potential wire and a third rear surface wire.

The cathode wire 111B is provided so as to face the cathode wire 111F provided on the front surface side of the heat releasing base member 100 with the heat releasing base member 100 interposed therebetween. An area of the cathode wire 111B is set smaller than an area of the cathode wire 111F. The cathode wire 111F and the cathode wire 111B are connected to each other through a through conductor 111V. The anode wire 112B is provided so as to face a part of an end, on the x direction side, of the anode wire 112F provided on the front surface side of the heat releasing base member 100 with the heat releasing base member 100 interposed therebetween. That is, an area of the anode wire 112B is smaller than an area of the anode wire 112F. The anode wire 112F and the anode wire 112B are electrically connected to each other by a through conductor 112V.

The reference potential wire 113B is provided between the cathode wire 111B and the anode wire 112B and extends in the ±y directions beyond the cathode wire 111B and the anode wire 112B. Ends, in the ±y directions, of the reference potential wire 113B are provided so as to face the two reference potential wires 113F provided on the front surface side of the heat releasing base member 100 with the heat releasing base member 100 interposed therebetween. The reference potential wires 113F and the reference potential wire 113B are electrically connected to each other by a through conductor 113V.

As described above, the cathode wire 111F and the cathode wire 111B that are provided on the front surface side and the rear surface side of the heat releasing base member 100, respectively and are electrically connected to each other have different shapes. Similarly, the anode wire 112F and the anode wire 112B that are provided on the front surface side and the rear surface side of the heat releasing base member 100, respectively and are electrically connected to each other have different shapes. Similarly, the reference potential wires 113F and the reference potential wire 113B that are provided on the front surface side and the rear surface side of the heat releasing base member 100, respectively and are electrically connected to each other have different shapes. As illustrated in FIG. 8C, edge parts of the reference potential wire 113B and edge parts of the cathode wire 111F indicated by the broken line overlap on the ±y direction sides and the −x direction side in top view. The cathode wire 111F and the reference potential wire 113B overlap each other by an overlapping width W1$o$.

Edge parts of the reference potential wire 113B and edge parts of the light source 20 indicated by the broken line also overlap on the ±y direction sides and the −x direction side. The cathode wire 111F and the light source 20 overlap each other by an overlapping width W2$o$. Each of the overlapping widths W1$o$ and W2$o$ is the same on the ±y direction sides and the −x direction side.

An area of the reference potential wire 113B provided on the rear surface side of the heat releasing base member 100 is set larger than an area of the cathode wire 111F and an area of the anode wire 112F provided on the front surface side of the heat releasing base member 100. The area of the reference potential wire 113B is set so as to encompass the capacitors 70A and 70B. That is, the capacitors 70A are 70B are included within the reference potential wire 113F in top view. Note that the area of the reference potential wire 113B provided on the rear surface side of the heat releasing base member 100 may be set larger than either the area of the cathode wire 111F or the area of the anode wire 112F provided on the front surface side of the heat releasing base member 100.

Figure 9:
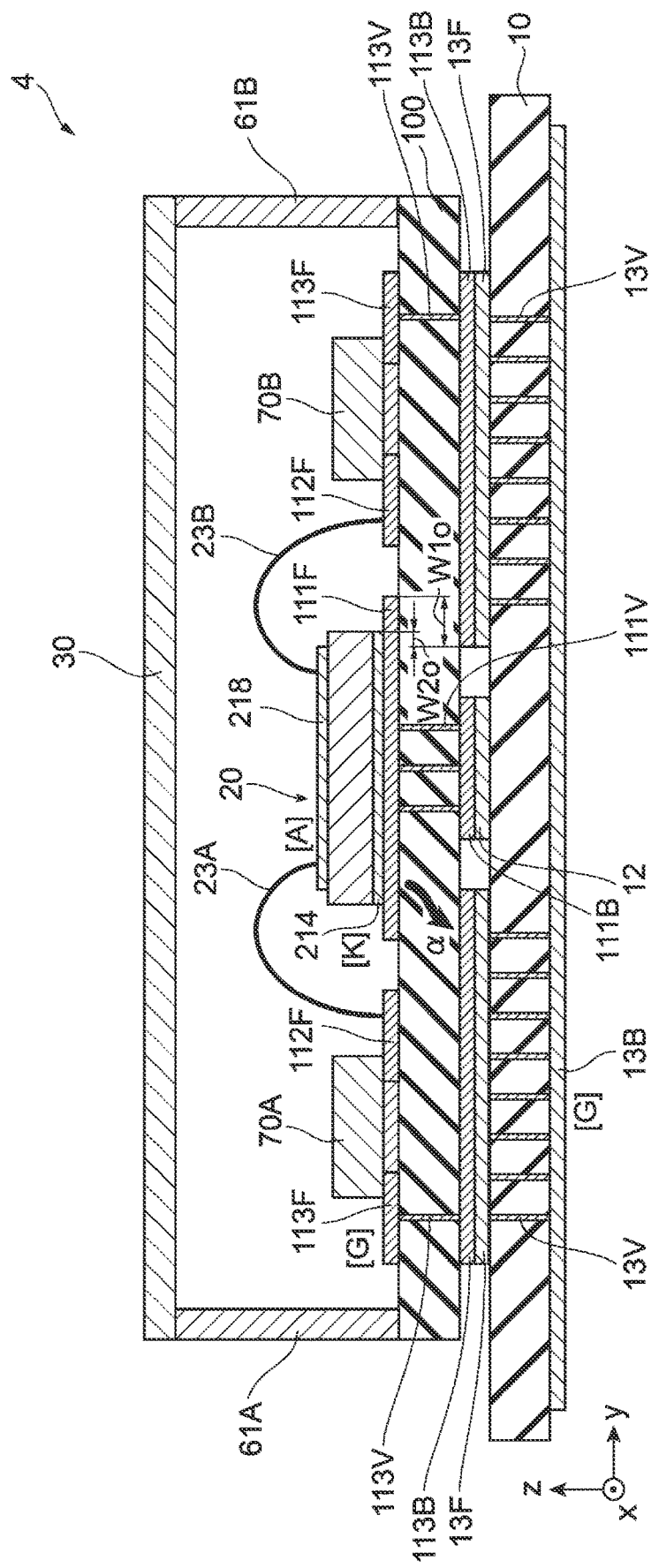
FIG. 9 is a view for further explaining a light-emitting device to which the first exemplary embodiment is applied.

FIG. 9 is a view for further explaining the light-emitting device 4 to which the first exemplary embodiment is applied. FIG. 9 is a cross-sectional view of the light-emitting device 4 taken along line IX-IX of FIG. 7A.

An electric connection relationship in the light-emitting device 4 is described with reference to FIGS. 7A, 7B, 8A, 8B, 8C, and 9.

As described above, the heat releasing base member 100 is provided on the front surface of the wiring substrate 10, and the light source 20 and the capacitors 70A and 70B are provided on the front surface of the heat releasing base member 100.

The cathode wire 11 provided on the front surface side of the wiring substrate 10 is connected to the driving unit 50 (see FIGS. 7A and 7B). The cathode wire 11 is connected to the cathode wire 111B provided on the rear surface side of the heat releasing base member 100, for example, by solder. The cathode wire 111B is connected to the cathode wire 111F provided on the front surface side of the heat releasing base member 100 through the through conductor 111V provided in the heat releasing base member 100. The light source 20 is mounted on the cathode wire 111F, and the cathode wire 111F is connected to the cathode electrode 214 of the light source 20 (see FIGS. 7B and 9).

The anode wire 12 provided on the front surface side of the wiring substrate 10 is connected to the anode wire 112B provided on the rear surface side of the heat releasing base member 100, for example, by solder. The anode wire 112B is connected to the anode wire 112F provided on the front surface side of the heat releasing base member 100 through the through conductor 112V provided in the heat releasing base member 100. The anode wire 112F is connected to the anode electrode 218 of the light source 20 through the bonding wires 23A and 23B (see FIGS. 7A and 9).

The reference potential wire 13F provided on the front surface side of the wiring substrate 10 is connected to the reference potential wire 13B provided on the rear surface side of the wiring substrate 10 through the through conductor 13V (see FIGS. 7B and 9). The reference potential wire 13F is connected to the reference potential wire 113B provided on the rear surface of the heat releasing base member 100, for example, by solder (FIGS. 7A and 9). The reference potential wire 113B is connected to the two reference potential wires 113F provided on the front surface side of the heat releasing base member 100 through the through conductor 113V provided in the heat releasing base member 100. Each of the capacitors 70A and 70B is disposed between one of the reference potential wires 113F and the anode wire 112F. Specifically, the capacitor 70A is provided between and is electrically connected to one, on the −y direction side, of the two reference potential wires 113F and the anode wire 112F. Similarly, the capacitor 70B is provided between and is electrically connected to one, on the +y direction side, of the two reference potential wires 113F and the anode wire 112F (see FIGS. 7A and 9).

The anode wire 112B provided on the rear surface side of the heat releasing base member 100 has a smaller area than the reference potential wire 113B. An electric charge is supplied from the power source 82 (see FIG. 6) to the anode wire 112B, and the capacitors 70A and 70B are thus charged. Accordingly, the anode wire 112B need just connect the anode wire 12 provided on the front surface of the wiring substrate 10 and the anode wire 112F provided on the front surface of the heat releasing base member 100 in a direct-current manner.

Next, a path for releasing heat generated by the light source 20 in the light-emitting device 4 to which the first exemplary embodiment is applied is described with reference to FIG. 9.

As described above, the light source 20 generates a large amount of heat. Accordingly, heat generated by the light source 20 needs to be easily released. As described above, a metal such as copper (Cu) used as a material of a wire has high thermal conductivity. For example, thermal conductivity of copper (Cu) is approximately 360 W/m·K, which is much higher than approximately 0.4 W/m·K of a substrate used as the wiring substrate 10. Accordingly, heat generated by the light source 20 is desirably released to an outside, for example, from a housing through the reference potential wire 13B provided on the rear surface side of the wiring substrate 10. In particular, the reference potential wire 13B has a larger area than the cathode wire 11 and the anode wire 12 provided on the front surface side of the wiring substrate 10. Accordingly, heat is easily released by transferring the heat to the reference potential wire 13B. That is, it is desirable to provide a short path for releasing the heat generated by the light source 20 to the reference potential wire 13B provided on the rear surface of the wiring substrate 10.

As illustrated in FIG. 9, the cathode electrode 214 of the light source 20 is provided on the cathode wire 111F provided on the front surface side of the heat releasing base member 100. Meanwhile, the anode electrode 218 of the light source 20 is connected to the anode wire 112F provided on the front surface side of the heat releasing base member 100 by the bonding wires 23A and 23B. Accordingly, heat generated by the light source 20 (hereinafter referred to as heat) is transferred along a path from the cathode electrode 214 to the cathode wire 111F, a path from the anode electrode 218 to the anode wire 112F through the bonding wires 23A and 23B, and a path to a space (air) around the light source 20. However, the heat is hard to transfer along the path to the bonding wires 23A and 23B and the path to a space (air) around the light source 20. Accordingly, the heat generated by the light source 20 is transferred along the path from the cathode electrode 214 to the cathode wire 111F.

As described above, thermal conductivity of the heat releasing base member 100 is 10 W/m·K or more, which is higher than approximately 0.4 W/m·K of a substrate used as the wiring substrate 10. Accordingly, the heat transfers from the anode wire 112F to the cathode wire 111B, the anode wire 112B, and the reference potential wire 113B provided on the rear surface side of the heat releasing base member 100 through the heat releasing base member 100. However, the cathode wire 111B and the anode wire 112B are connected to the cathode wire 11 and the anode wire 12 of the wiring substrate 10, respectively. Neither the cathode wire 11 nor the anode wire 12 is connected to the reference potential wire 13B. Meanwhile, the reference potential wire 113F is connected to the reference potential wire 13F provided on the front surface side of the wiring substrate 10, and the reference potential wire 13F is connected to the reference potential wire 13B provided on the rear surface side of the wiring substrate 10 through the through conductor 13V. Accordingly, heat that transfers to the reference potential wire 113B provided on the rear surface side of the heat releasing base member 100 transfers to the reference potential wire 13B through the reference potential wire 13F and the through conductor 13V (path a in FIG. 9).

As described above, in the light-emitting device 4 to which the first exemplary embodiment is applied, heat generated by the light source 20 is released along a path passing the cathode wire 111F provided on the front surface side of the heat releasing base member 100, the heat releasing base member 100, the reference potential wire 113B provided on the rear surface side of the heat releasing base member 100, the reference potential wire 13F provided on the front surface of the wiring substrate 10, the through conductor 13V, and the reference potential wire 13B provided on the rear surface side of the wiring substrate 10 in this order.

The reference potential wire 113B provided on the rear surface side of the heat releasing base member 100 and the cathode wire 111F provided on the front surface side of the heat releasing base member 100 are provided so as to overlap each other by the overlapping width W1o in top view. This shortens a path along which heat transfers from the cathode wire 111F to the reference potential wire 113B.

Furthermore, the reference potential wire 113B provided on the rear surface side of the heat releasing base member 100 and the light source 20 are provided so as to overlap each other by the overlapping width W2o in top view. This further shortens a path along which heat transfers from the light source 20 to the reference potential wire 113B. With these configurations, heat generated by the light source 20 is easily released. For this reason, an area of the cathode wire 111B provided on the rear surface side of the heat releasing base member 100 is set smaller than an area of the cathode wire 111F provided on the front surface side of the heat releasing base member 100.

The heat transfers from the cathode wire 111F to the reference potential wire 113B through the heat releasing base member 100 having high thermal conductivity, as long as the cathode wire 111F is provided on the front surface side of the heat releasing base member 100 and the reference potential wire 113B is provided on the rear surface side of the heat releasing base member 100. Accordingly, the reference potential wire 113B and the cathode wire 111F need not necessarily overlap each other in top view. Similarly, the reference potential wire 113B and the light source 20 need not necessarily overlap each other in top view.

As described above, the heat generated by the light source 20 is released to the reference potential wire 13B provided on the rear surface side of the wiring substrate 10 through the heat releasing base member 100 having high thermal conductivity. Accordingly, heat generated by the light source 20 is more easily released than in a case where heat is released through the wiring substrate 10 having thermal conductivity lower than the heat releasing base member 100.

Next, a path (hereinafter referred to as an electric current path) through which an electric current (electric charge) for causing the VCSELs (the light source 20) to emit light flows is described.

The electric current (electric charge) flows from the capacitor 70A to the VCSELs (the light source 20) through the anode wire 112F of the heat releasing base member 100 and the bonding wire 23A. Then, the electric current (electric charge) flows from the VCSELs (the light source 20) to the MOS transistor 51 (see FIG. 6) of the driving unit 50 through the cathode wire 111F, the through conductor 111V, and the cathode wire 111B of the heat releasing base member 100, and the cathode wire 11 of the wiring substrate 10. Next, the electric current (electric charge) returns from the MOS transistor 51 of the driving unit 50 to the capacitor 70A through the reference potential wire 13B, the through conductor 13V, and the reference potential wire 13F of the wiring substrate 10 and the reference potential wire 113B, the through conductor 113V, and the reference potential wire 113F of heat releasing base member 100. The same applies to the capacitor 70B.

The electric current path becomes shorter as a distance from the capacitors 70A and 70B to the VCSELs (the light source 20) becomes shorter. This reduces the circuit inductance, thereby shortening a rise time of light emission of the VCSELs. In the light-emitting device 4 to which the first exemplary embodiment is applied, the distance from the capacitors 70A and 70B to the light source 20 is set short since the light source 20 and the capacitors 70A and 70B are provided on the front surface of the heat releasing base member 100.

Next, a light-emitting device 4' to which the first exemplary embodiment is not applied is described for comparison.

Figure 10A:
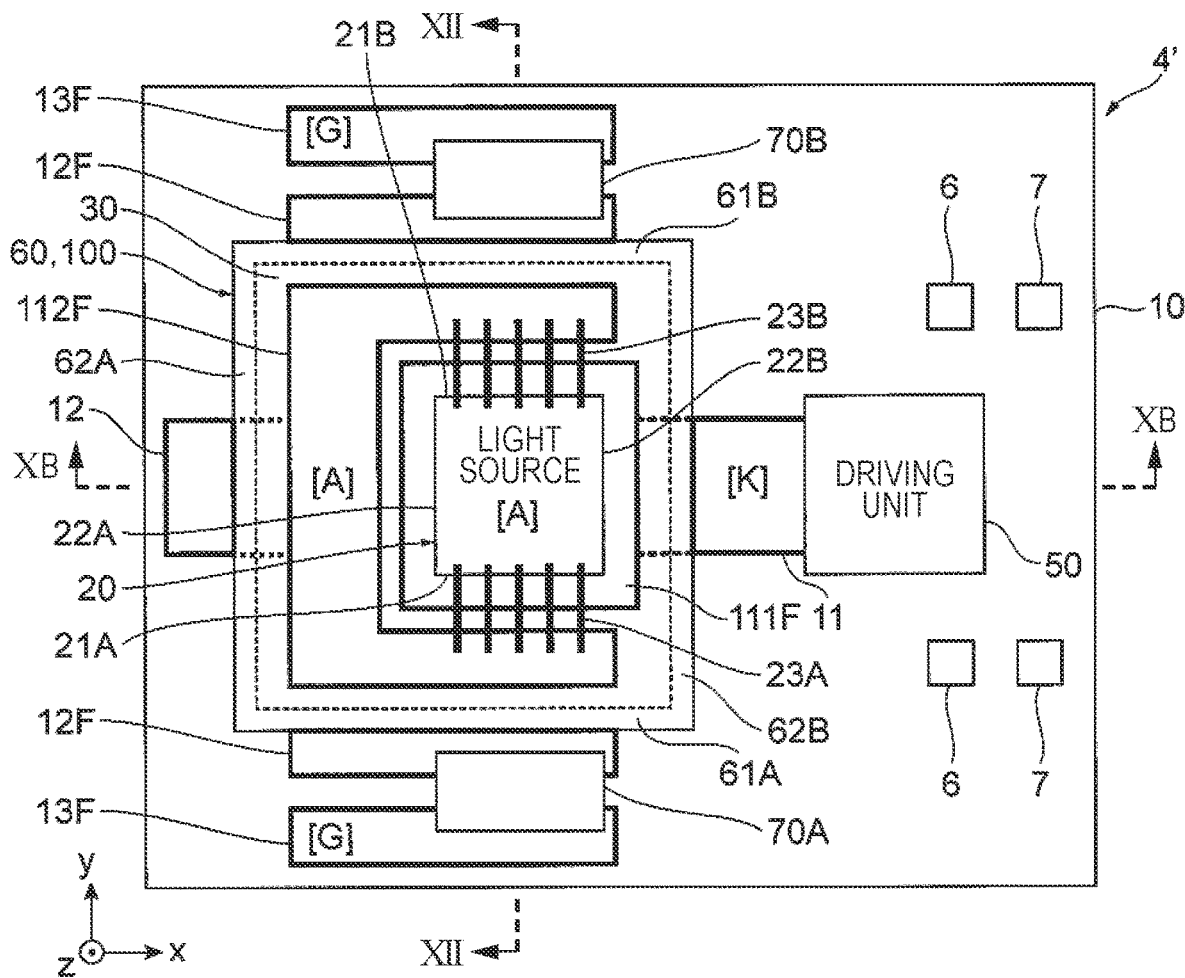
FIGS. 10A and 10B are views for explaining a light-emitting device to which the first exemplary embodiment is not applied.
Figure 10B:
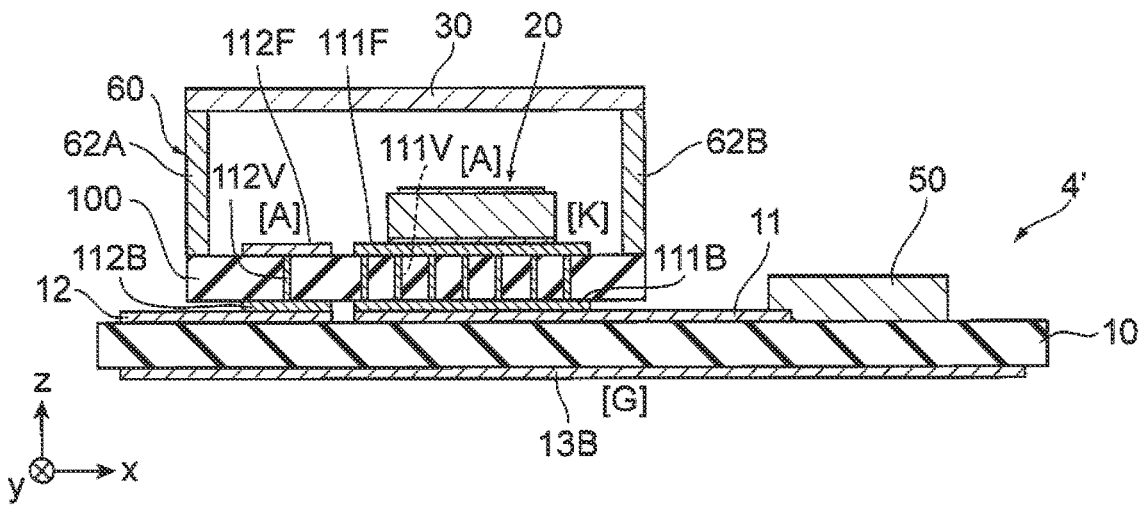

FIGS. 10A and 10B are views for explaining the light-emitting device 4' to which the first exemplary embodiment is not applied. FIG. 10A is a plan view, and FIG. 10B is a cross-sectional view taken along line XB-XB of FIG. 10A. Parts of the light-emitting device 4' that have identical functions to those of the light-emitting device 4 are given identical reference signs even if these parts have shapes different from those of the light-emitting device 4. In the following description, description of parts similar to those of the light-emitting device 4 is omitted, and differences are described.

As illustrated in FIG. 10A, the light-emitting device 4' has capacitors 70A and 70B on a wiring substrate 10 and a light source 20 on a front surface of a heat releasing base member 100. A holding unit 60 is provided on the front surface of the heat releasing base member 100. That is, a light diffusing member 30 provided on the holding unit 60 covers the light source 20 but does not cover the capacitors 70A and 70B.

Figure 11A:
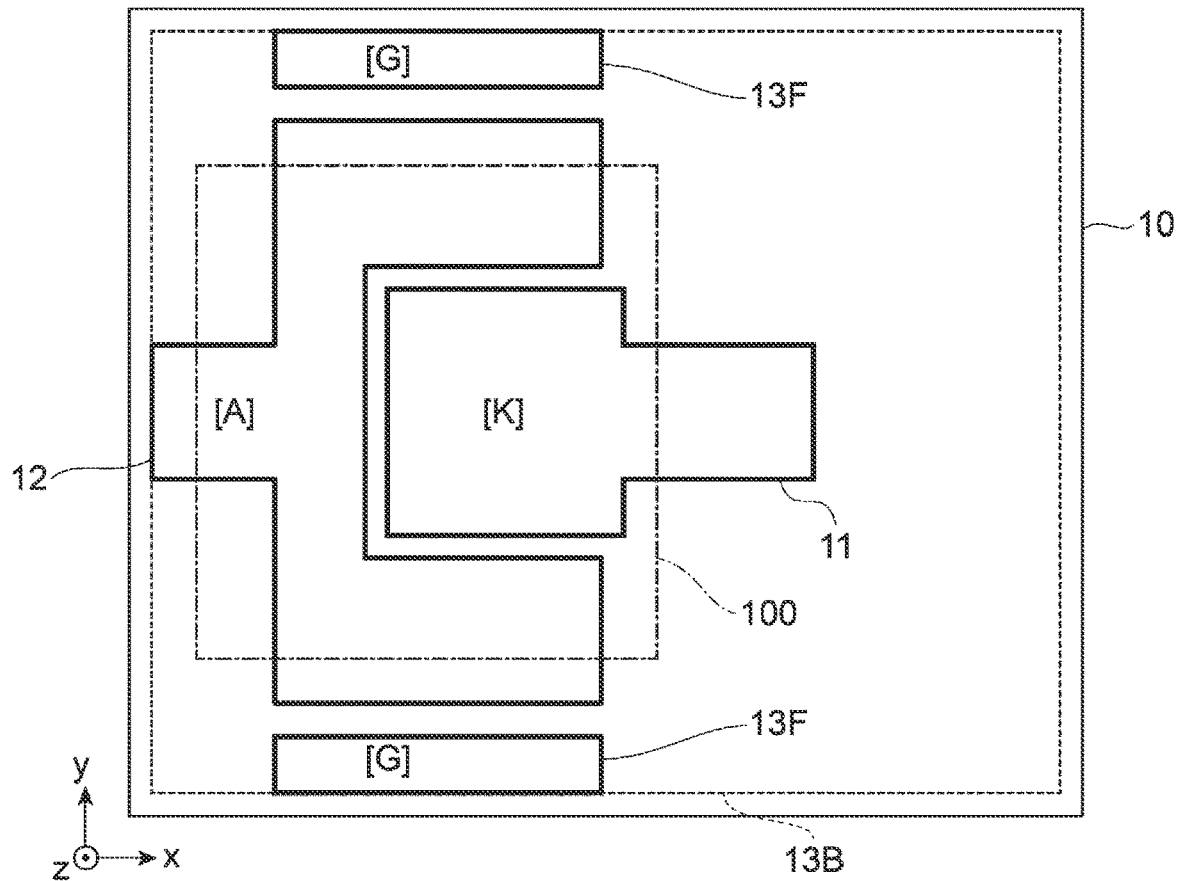
FIGS. 11A through 11C are views for explaining wires provided on a wiring substrate and wires provided on a heat releasing base member in the light-emitting device to which the first exemplary embodiment is not applied.
Figure 11B:
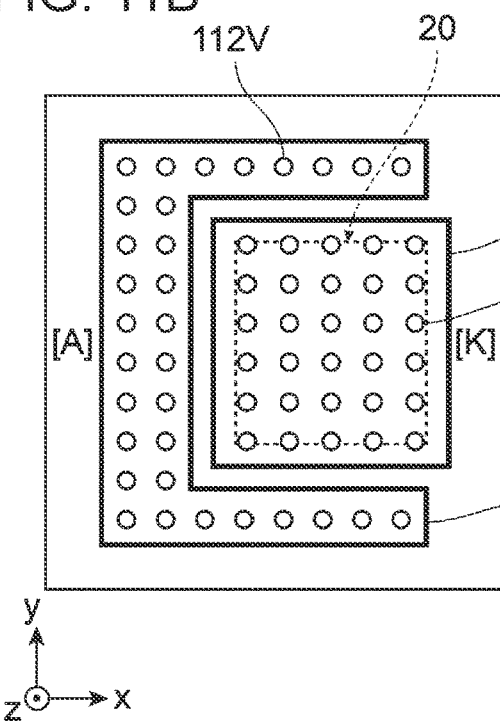
Figure 11C:
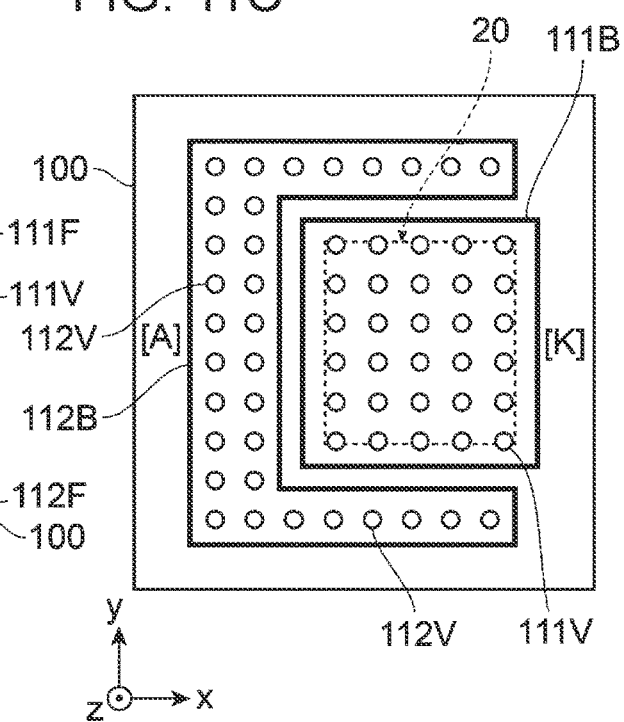

FIGS. 11A through 11C are views for explaining wires provided on the wiring substrate 10 and wires provided on the heat releasing base member 100 in the light-emitting device 4' to which the first exemplary embodiment is not applied. FIG. 11A illustrates wires provided on the wiring substrate 10, FIG. 11B illustrates wires provided on the front surface of the heat releasing base member 100, and FIG. 11C illustrates wires provided on a rear surface of the heat releasing base member 100.

First, the wires provided on the wiring substrate 10 illustrated in FIG. 11A are described. In FIG. 11A, an external shape of the heat releasing base member 100 is indicated by the line with alternate long and short dashes.

In FIG. 11A, the wires provided on a front surface side of the wiring substrate 10 are indicated by the solid lines, and the wires provided on a rear surface side of the wiring substrate 10 are indicated by the broken lines.

A cathode wire 11, an anode wire 12, and reference potential wires 13F that are insulated from one another are provided on the front surface side of the wiring substrate 10.

The cathode wire 11 is configured such that a planar shape thereof on a −x direction side is quadrangular and an end thereof drawn out on a +x direction side is connected to a driving unit 50. The quadrangular part on the −x direction side is connected to a cathode electrode 214 of the light source 20 through the heat releasing base member 100 (see FIGS. 10A and 10B).

The anode wire 12 is provided so as to surround three sides (the −x direction side and the ±y direction sides) of the cathode wire 11. The part drawn out on the −x direction side is connected to a + side of a power source 82. The anode wire 12 is connected to an anode electrode 218 of the light source 20 through the heat releasing base member 100 and bonding wires 23A and 23B.

The two reference potential wires 13F have a quadrangular planar shape and are provided on the ±y direction sides of the anode wire 12, respectively.

A reference potential wire 13B is provided on the rear surface side of the wiring substrate 10. The two reference potential wires 13F provided on the front surface of the wiring substrate 10 and the reference potential wire 13B provided on the rear surface of the wiring substrate 10 are electrically connected to each other through an electrically conductive through conductor 13V (see FIG. 12, which will be described later). The reference potential wire 13B is provided over the whole rear surface of the wiring substrate 10.

Next, the wires provided on the heat releasing base member 100 illustrated in FIGS. 11B and 11C are described.

As illustrated in FIG. 11B, a cathode wire 111F and an anode wire 112F that are insulated from each other are provided on the front surface side of the heat releasing base member 100. A cathode electrode 214 side of the light source 20 is mounted on a front surface of the cathode wire 111F (see FIG. 10B). The anode wire 112F is provided so as to surround three sides (the −x direction side and the ±y direction sides) of the cathode wire 111F. The anode wire 112F is connected to the anode electrode 218 of the light source 20 by the bonding wires 23A and 23B on the ±y direction sides (see FIG. 10A).

As illustrated in FIG. 11C, a cathode wire 111B and an anode wire 112B that are insulated from each other are provided on the rear surface side of the heat releasing base member 100. Planar shapes of the cathode wire 111B and the anode wire 112B are identical to those of the cathode wire 111F and the anode wire 112F provided on the front surface side of the heat releasing base member 100 illustrated in FIG. 11B.

The cathode wire 111F and the cathode wire 111B are connected to each other through a through conductor 111V. The anode wire 112F and the anode wire 112B are electrically connected to each other through a through conductor 112V.

As described above, the reference potential wires 113F and 113B, which are provided on the heat releasing base member 100 of the light-emitting device 4, are not provided on the heat releasing base member 100 of the light-emitting device 4' to which the first exemplary embodiment is not applied.

Figure 12:
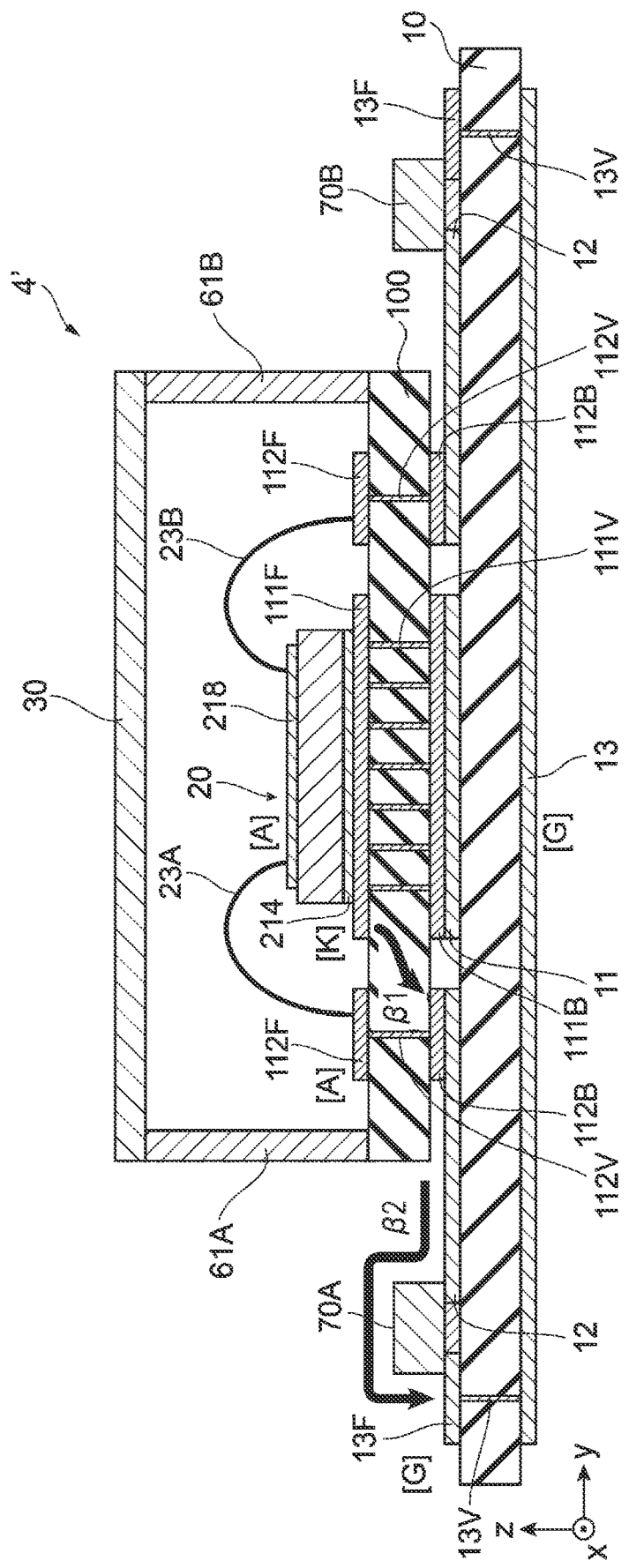
FIG. 12 is a view for further explaining a light-emitting device to which the first exemplary embodiment is not applied.

FIG. 12 is a view for further explaining the light-emitting device 4' to which the first exemplary embodiment is not applied. FIG. 12 is a cross-sectional view of the light-emitting device 4' of FIG. 10A taken along line XII-XII.

An electric connection relationship in the light-emitting device 4' to which the first exemplary embodiment is not applied is described with reference to FIGS. 10A, 10B, 11A, 11B, 11C, and 12.

As described above, the heat releasing base member 100 is provided on the front surface of the wiring substrate 10, and the light source 20 is provided on the front surface of the heat releasing base member 100. The capacitors 70A and 70B are provided on the front surface of the wiring substrate 10.

The cathode wire 11 provided on the front surface side of the wiring substrate 10 is connected to the driving unit 50 (see FIGS. 10A and 10B). The cathode wire 11 is connected to the cathode wire 111B provided on the rear surface side of the heat releasing base member 100, for example, by solder. The cathode wire 111B is connected to the cathode wire 111F provided on the front surface of the heat releasing base member 100 through the through conductor 111V provided in the heat releasing base member 100. The light source 20 is mounted on the cathode wire 111F, which is connected to the cathode electrode 214 of the light source 20 (see FIGS. 10B and 12).

The anode wire 12 provided on the front surface side of the wiring substrate 10 is connected to the anode wire 112B provided on the rear surface side of the heat releasing base member 100, for example, by solder. The anode wire 112B is connected to the anode wire 112F provided on the front surface side of the heat releasing base member 100 through a through conductor 112V provided in the heat releasing base member 100. The anode wire 112F is connected to the anode electrode 218 of the light source 20 through the bonding wires 23A and 23B (see FIGS. 10A and 12).

The reference potential wires 13F provided on the front surface side of the wiring substrate 10 are connected to the reference potential wire 13B provided on the rear surface side of the wiring substrate 10 through a through conductor 13V (see FIGS. 10B and 12). Each of the capacitors 70A and 70B is disposed between the reference potential wire 13F and the anode wire 12 on the wiring substrate 10. That is, as illustrated in FIG. 11A, the capacitor 70A is electrically connected between the reference potential wire 13F on the −y side of the wiring substrate 10 and the anode wire 12. Similarly, the capacitor 70B is electrically connected between the reference potential wire 13F on the +y side of the wiring substrate 10 and the anode wire 12.

Next, a path along which heat generated by the light source 20 is released in the light-emitting device 4' to which the second exemplary embodiment is not applied is described with reference to FIG. 12.

As described above, heat generated by the light source 20 transfers along a path from the cathode electrode 214 of the light source 20 to the cathode wire 111F provided on the heat releasing base member 100. The heat transfers to the cathode wire 111B and the anode wire 112B provided on the rear surface of the heat releasing base member 100 through the heat releasing base member 100. Furthermore, the heat transfers from the cathode wire 111B and the anode wire 112B to the cathode wire 11 and the anode wire 12 provided on the front surface side of the wiring substrate 10. However, thermal conductivity of the wiring substrate 10 is smaller than that of a metal such as copper (Cu), as described above. Accordingly, the heat transfers from the anode wire 12 provided on the front surface side of the wiring substrate 10 to the reference potential wires 13F through the capacitors 70A and 70B (path β1 in FIG. 12). Then, the heat transfers from the reference potential wires 13F to the reference potential wire 13B provided on the rear surface side of the wiring substrate 10 through the through conductor 13V (path β2 in FIG. 12).

As described above, in the light-emitting device 4' for comparison to which the first exemplary embodiment is not applied, heat generated by the light source 20 is released along a path passing the cathode wire 111F provided on the front surface side of the heat releasing base member 100, the heat releasing base member 100, the anode wire 112B provided on the rear surface side of the heat releasing base member 100, the anode wire 12 provided on the front surface side of the wiring substrate 10, the capacitors 70A and 70B, the reference potential wires 13F, and the through conductor 13V, and the reference potential wire 13B provided on the rear surface side of the wiring substrate 10 in this order. That is, in the light-emitting device 4', the heat is hard to transfer to the reference potential wire 13B provided on the rear surface side of the wiring substrate 10 although the heat releasing base member 100 having high thermal conductivity is used. This inhibits transfer of heat from the light source 20.

In the light-emitting device 4 to which the first exemplary embodiment is applied, the reference potential wires 113F and 113B are provided on the heat releasing base member 100. This creates a path along which heat generated by the light source 20 transfers to the reference potential wire 13B provided on the rear surface side of the wiring substrate 10 through the reference potential wire 13F provided on the front surface side of the wiring substrate 10 and the through conductor 13V provided in the wiring substrate 10. As illustrated in FIG. 9, it is only necessary that heat generated by the light source 20 transfer to the reference potential wire 113B provided on the rear surface side of the heat releasing base member 100, and therefore it is only necessary that the reference potential wire 113B be provided on the rear surface side of the heat releasing base member 100.

Meanwhile, in the light-emitting device 4' to which the first exemplary embodiment is not applied, the reference potential wires 113F and 113B are not provided on the heat releasing base member 100. Accordingly, a path along which heat generated by the light source 20 transfers to the reference potential wire 13B provided on the rear surface side of the wiring substrate 10 is hard to be formed.

Next, a path (electric current path) along which an electric current (charge) for causing the VCSELs (the light source 20) to emit light flows in the light-emitting device 4' to which the first exemplary embodiment is not applied is described.

An electric current (charge) flows from the capacitor 70A to the VCSELs (the light source 20) through the anode wire 12 of the wiring substrate 10, the anode wire 112B of the heat releasing base member 100, the through conductor 112V, the anode wire 112F, and the bonding wire 23A. The electric current (charge) flows from the VCSELs (the light source 20) to an MOS transistor 51 (see FIG. 6) of the driving unit 50 through the cathode wire 111F, the through conductor 111V, and the cathode wire 111B of the heat releasing base member 100 and the cathode wire 11 of the wiring substrate 10. Next, the electric current (charge) returns from the MOS transistor 51 of the driving unit 50 to the capacitor 70A through the reference potential wire 13B, the through conductor 13V, and the reference potential wire 13F of the wiring substrate 10. The same applies to the capacitor 70B.

In the light-emitting device 4', the capacitors 70A and 70B are provided on the front surface of the wiring substrate 10, and the VCSELs (the light source 20) are provided on the front surface of the heat releasing base member 100. Accordingly, a distance from the capacitors 70A and 70B to the VCSELs (the light source 20) is larger than that in the light-emitting device 4 to which the first exemplary embodiment is applied. Accordingly, the light-emitting device 4' is larger in circuit inductance and longer in rise time of light emission of the VCSELs than the light-emitting device 4.

That is, in the light-emitting device 4 to which the first exemplary embodiment is applied, the VCSELs (the light source 20) and the capacitors 70A and 70B are provided on the front surface of the heat releasing base member 100, and therefore a distance from the capacitors 70A and 70B to the VCSELs (the light source 20) is set short. This shortens a rise time of light emission of the VCSELs.

Second Exemplary Embodiment

The two capacitors 70A and 70B are used in the light-emitting device 4 to which the first exemplary embodiment is applied. Furthermore, a part of an edge part of the cathode wire 111F provided on the front surface side of the heat releasing base member 100 and a part of an edge part of the reference potential wire 113B provided on the rear surface side of the heat releasing base member 100 overlap each other in top view. In a light-emitting device 4 to which the second exemplary embodiment is applied, a single capacitor 70 is used, and a cathode wire 111F provided on a front surface side of a heat releasing base member 100 and a reference potential wire 113B provided on a rear surface side of the heat releasing base member 100 do not overlap each other in top view. In the second exemplary embodiment, parts having identical functions to those in the first exemplary embodiment are given identical reference signs, and repeated description thereof is omitted. The following describes differences from the first exemplary embodiment.

Figure 13A:
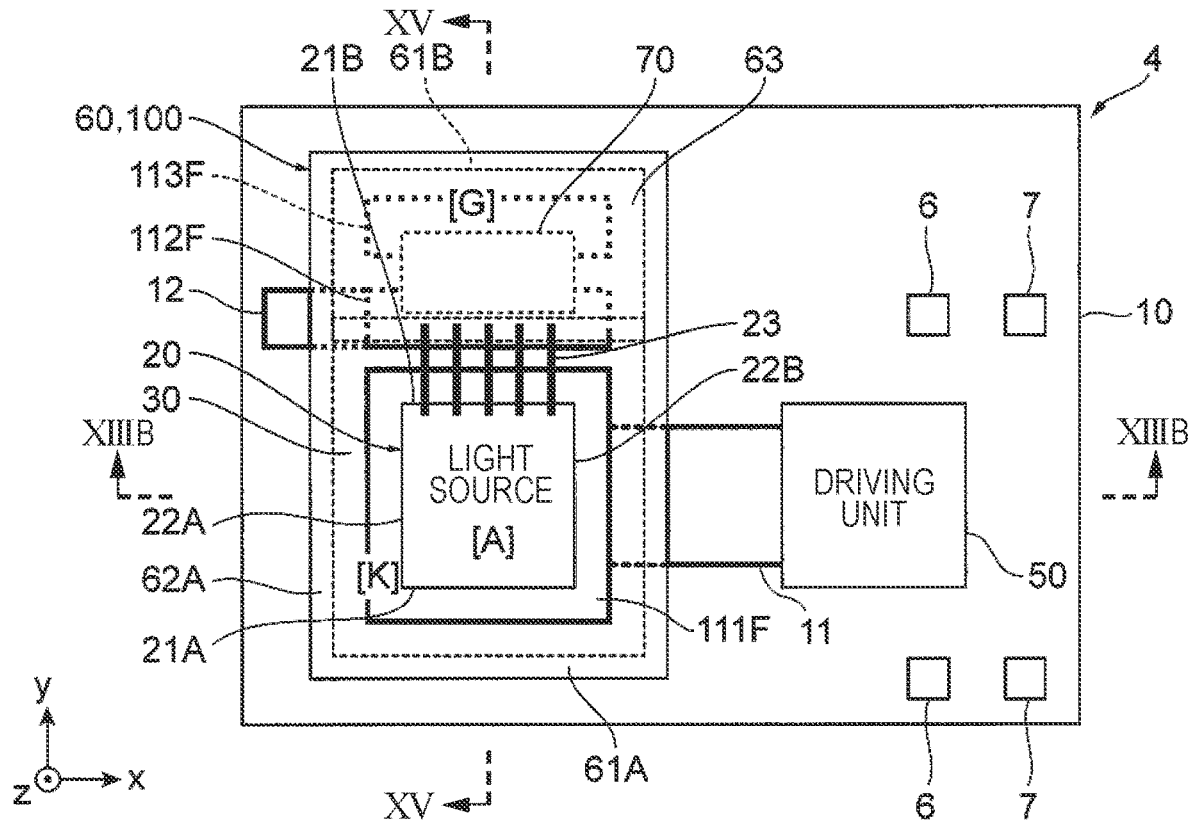
FIGS. 13A and 13B are views for explaining a light-emitting device to which the second exemplary embodiment is applied.
Figure 13B:
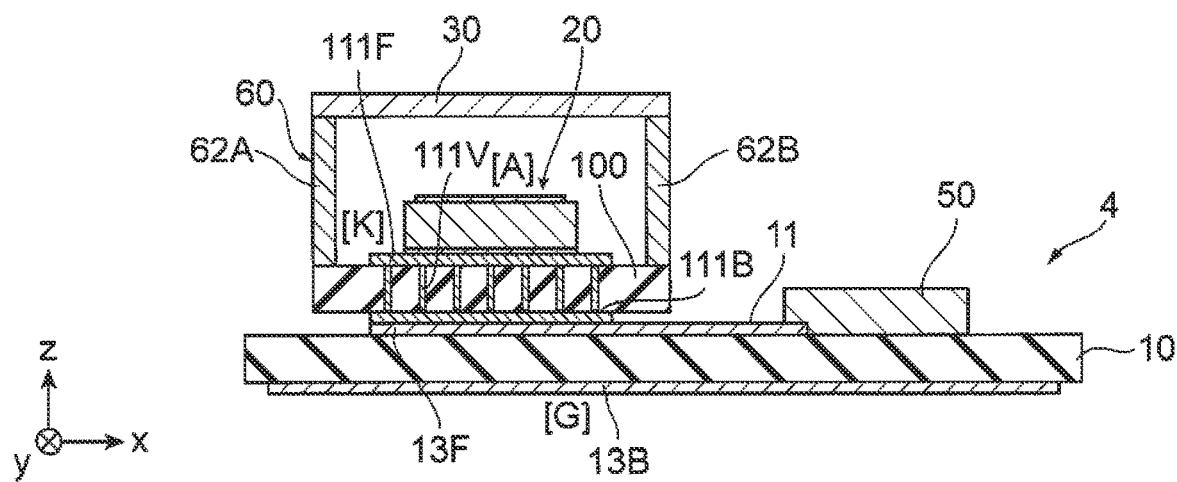

FIGS. 13A and 13B are views for explaining the light-emitting device 4 to which the second exemplary embodiment is applied. FIG. 13A is a plan view, and FIG. 13B is a cross-sectional view taken along line XIIIB-XIIIB of FIG. 13A. FIG. 13A is a view seen through a light diffusing member 30.

As illustrated in FIGS. 13A and 13B, the heat releasing base member 100, a driving unit 50, a resistive element 6, and a capacitor 7 are provided on a front surface of a wiring substrate 10. A light source 20, a capacitor 70, and a holding unit 60 are provided on the front surface of the heat releasing base member 100. The light diffusing member 30 is provided on the holding unit 60. As illustrated in FIG. 13A, the light diffusing member 30 is provided so as to cover the light source 20 and not to cover the capacitor 70.

Figure 14A:
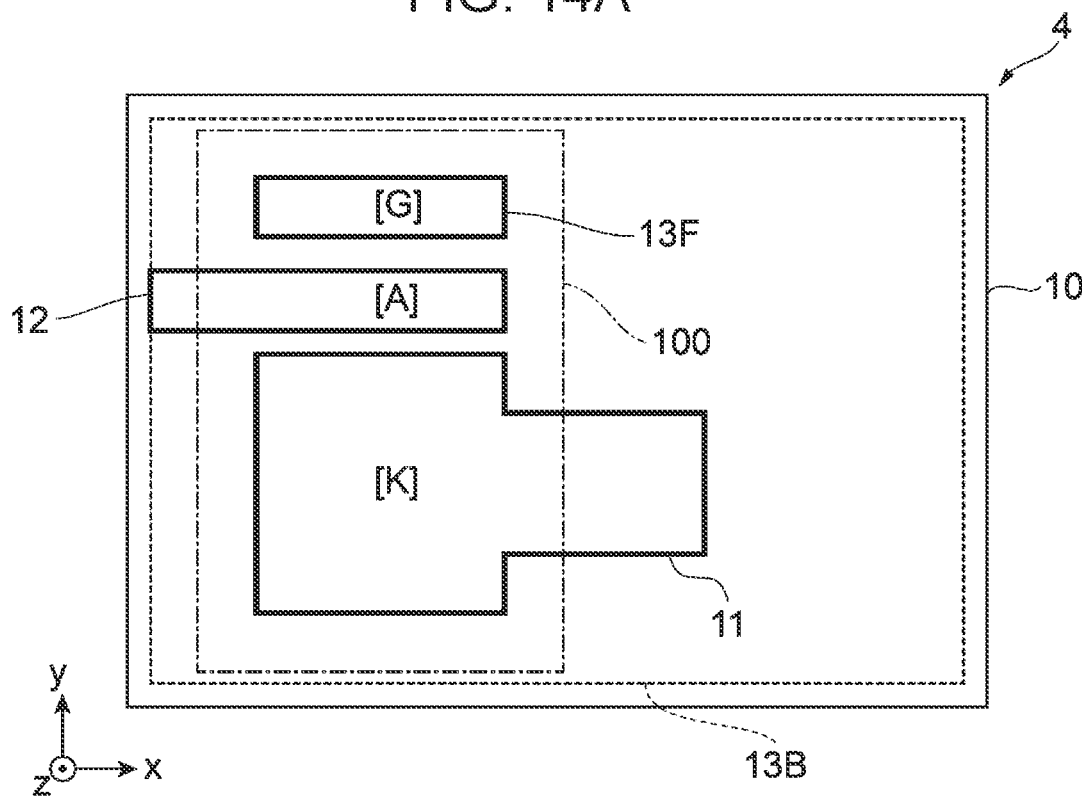
FIGS. 14A through 14C are views for explaining wires provided on a wiring substrate and wires provided on a heat releasing base member in a light-emitting device to which the second exemplary embodiment is applied.
Figure 14B:
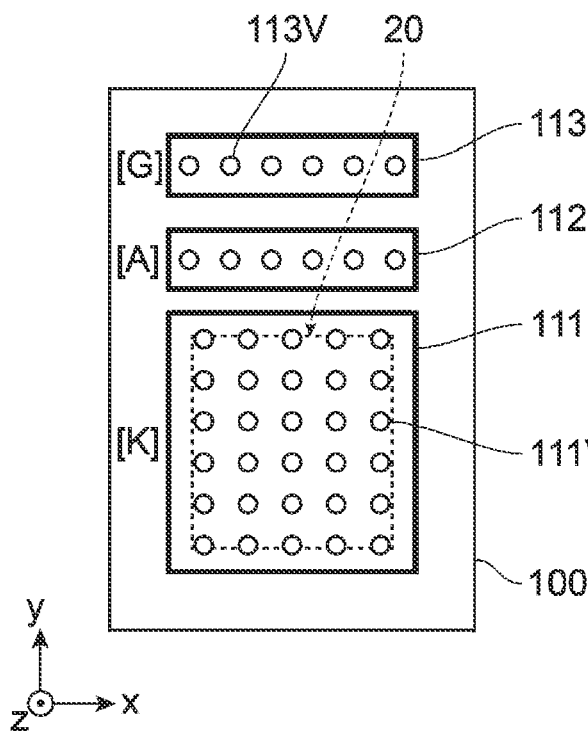
Figure 14C:
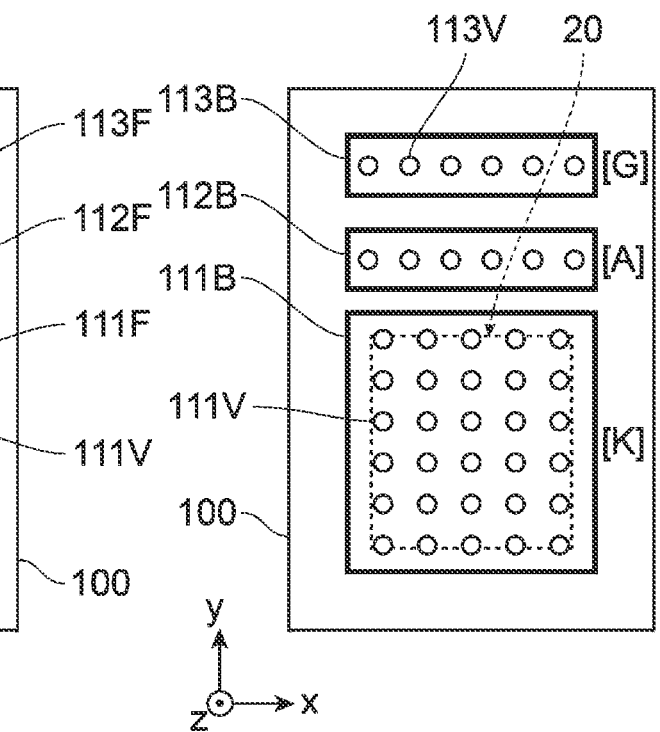

FIGS. 14A through 14C are views for explaining wires provided on the wiring substrate 10 and wires provided on the heat releasing base member 100 in the light-emitting device 4 to which the second exemplary embodiment is applied. FIG. 14A illustrates wires provided on the wiring substrate 10, FIG. 14B illustrates wires provided on the front surface side of the heat releasing base member 100, and FIG. 14C illustrates wires provided on the rear surface side of the heat releasing base member 100.

First, the wires provided on the wiring substrate 10 illustrated in FIG. 14A are described. In FIG. 14A, an external shape of the heat releasing base member 100 is indicated by the line with alternate long and short dashes.

In FIG. 14A, the wires provided on the front surface side of the wiring substrate 10 are indicated by the solid lines, and the wire provided on the rear surface side of the wiring substrate 10 is indicated by the broken lines.

A cathode wire 11, an anode wire 12, and a reference potential wire 13F that are insulated from one another are provided on the front surface side of the wiring substrate 10.

The cathode wire 11 is configured such that a planar shape thereof on a −x direction side is rectangular and an end thereof drawn out on a +x direction side is connected to the driving unit 50. The rectangular part on the −x direction side is connected to a cathode electrode 214 of the light source 20 through the heat releasing base member 100 (see FIGS. 13A and 13B).

The anode wire 12 has a rectangular planar shape and is provided so as to face the rectangular part of the cathode wire 11 in a +y direction. The anode wire 12 has a part drawn out in the −x direction, and this part is connected to the + side of a power source 82. The anode wire 12 is connected to an anode electrode 218 of the light source 20 through the heat releasing base member 100 and bonding wires 23A and 23B.

The reference potential wire 13F has a rectangular planar shape and is provided so as to face the anode wire 12 in the +y direction.

The reference potential wire 13B is provided on the rear surface side of the wiring substrate 10. The reference potential wire 13F provided on the front surface side of the wiring substrate 10 and the reference potential wire 13B provided on the rear surface side of the wiring substrate 10 are electrically connected to each other through an electrically-conductive through conductor 13V (see FIG. 15, which will be described later). The reference potential wire 13B is provided over the entire rear surface of the wiring substrate 10.

Next, wires provided on the heat releasing base member 100 illustrated in FIGS. 14B and 14C are described.

As illustrated in FIG. 14B, a cathode wire 111F, an anode wire 112F, and a reference potential wire 113F that are insulated from one another are provided on the front surface side of the heat releasing base member 100. The cathode wire 111F has a quadrangular planar shape, and a cathode electrode 214 side of the light source 20 is mounted on a front surface of the cathode wire 111F (see FIG. 13B). The anode wire 112F has a quadrangular planar shape and is provided so as to face a +y side of the cathode wire 111F. The anode wire 112F is connected to the anode electrode 218 of the light source 20 through a bonding wire 23 (see FIG. 13A).

As illustrated in FIG. 14C, a cathode wire 111B, an anode wire 112B, and a reference potential wire 113B that are insulated from one another are provided on the rear surface side of the heat releasing base member 100. Planar shapes of the cathode wire 111B, the anode wire 112B, and the reference potential wire 113B are identical to those of the cathode wire 111F, the anode wire 112F, and the reference potential wire 113F provided on the front surface side of the heat releasing base member 100 illustrated in FIG. 14B, respectively.

The cathode wire 111F and the cathode wire 111B are connected through a through conductor 111V. The anode wire 112F and the anode wire 112B are electrically connected to each other through a through conductor 112V. The reference potential wire 113F and the reference potential wire 113B are electrically connected to each other through a through conductor 113V.

As described above, in the light-emitting device 4 to which the second exemplary embodiment is applied, the reference potential wires 113F and 113B are provided on the heat releasing base member 100, as in the light-emitting device 4 to which the first exemplary embodiment is applied.

Figure 15:
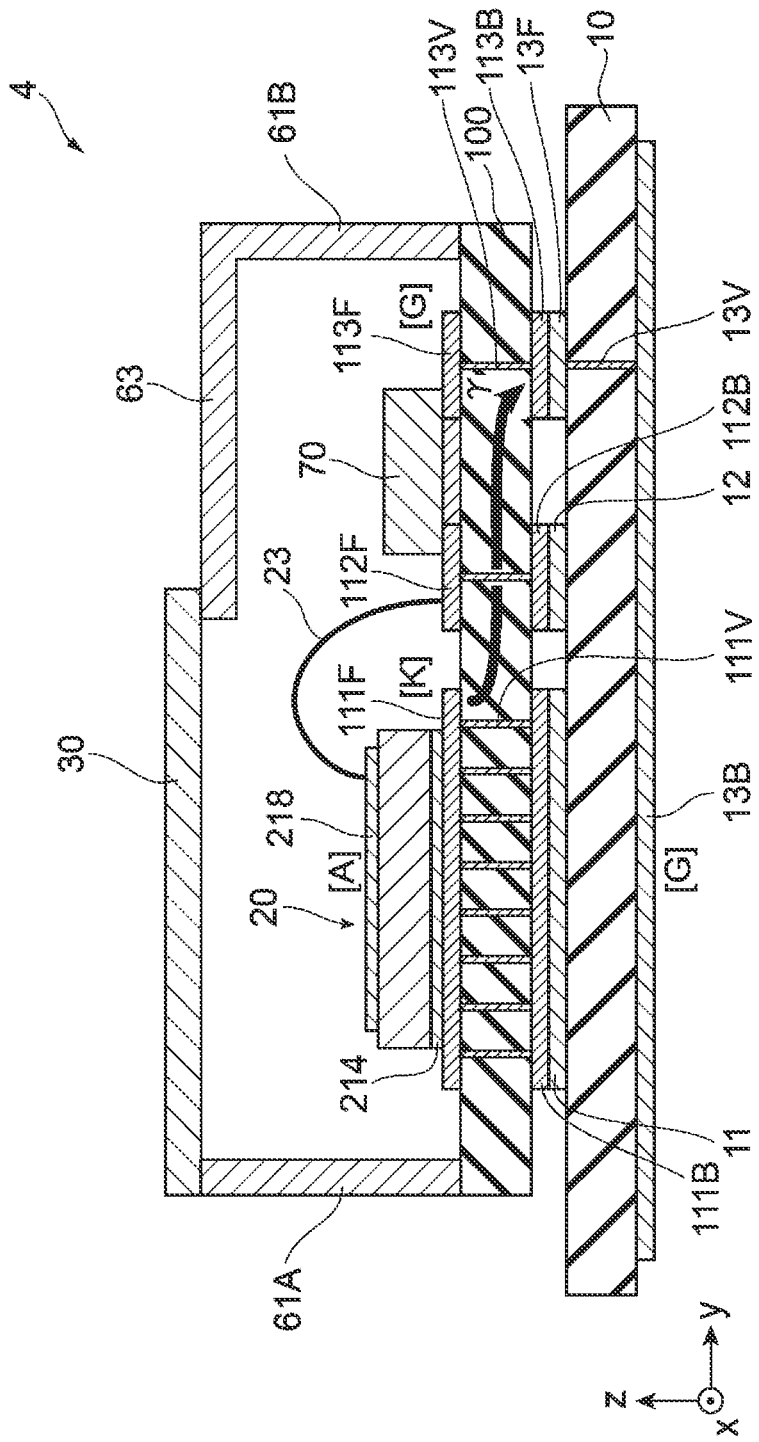
FIG. 15 is a view for further explaining a light-emitting device to which the second exemplary embodiment is applied.

FIG. 15 is a view for explaining the light-emitting device 4 to which the second exemplary embodiment is applied. FIG. 15 is a cross-sectional view of the light-emitting device 4 of FIG. 13A taken along line XV-XV.

First, the holding unit 60 and the light diffusing member 30 are described with reference to FIGS. 13A and 15.

The holding unit 60 has a lid 63 in addition to walls 61A, 61B, 62A, and 62B. The lid 63 is a part of an upper side (+z direction) of the holding unit 60 and covers the capacitor 70. The light diffusing member 30 is provided on the holding unit 60 in a part where the lid 63 is not provided. This reduces an area of the light diffusing member 30, that is, a size of the light diffusing member 30. Since the light diffusing member 30 is expensive, a smaller area of the light diffusing member 30 means a lower cost.

An electric connection relationship in the light-emitting device 4 to which the second exemplary embodiment is applied is described with reference to FIGS. 13A, 13B, 14, and 15.

As described above, the heat releasing base member 100 is provided on the front surface of the wiring substrate 10, and the light source 20 and the capacitor 70 are provided on the front surface of the heat releasing base member 100.

The cathode wire 11 provided on the front surface side of the wiring substrate 10 is connected to the driving unit 50 (see FIGS. 13A and 13B). The cathode wire 11 is connected to the cathode wire 111B provided on the rear surface side of the heat releasing base member 100, for example, by solder. The cathode wire 111B is connected to the cathode wire 111F provided on the front surface side of the heat releasing base member 100 through the through conductor 111V provided in the heat releasing base member 100. The light source 20 is mounted on the cathode wire 111F, which is connected to the cathode electrode 214 of the light source 20 (see FIGS. 13B and 15).

The anode wire 12 provided on the front surface side of the wiring substrate 10 is connected to the anode wire 112B provided on the rear surface of the heat releasing base member 100, for example, by solder. The anode wire 112B is connected to the anode wire 112F provided on the front surface side of the heat releasing base member 100 through the through conductor 112V provided in the heat releasing base member 100. The anode wire 112F is connected to the anode electrode 218 of the light source 20 through the bonding wires 23A and 23B (see FIGS. 13A and 15).

The reference potential wire 13F provided on the front surface side of the wiring substrate 10 is connected to the reference potential wire 13B provided on the rear surface side of the wiring substrate 10 through the through conductor 13V (see FIG. 15). The reference potential wire 13F is connected to the reference potential wire 113B provided on the rear surface side of the heat releasing base member 100, for example, by solder (see FIGS. 13A and 15). The reference potential wire 113B is connected to the reference potential wire 113F provided on the front surface side of the heat releasing base member 100 through the through conductor 113V provided in the heat releasing base member 100. The capacitor 70 is disposed between the reference potential wire 113F and the anode wire 112F. That is, the capacitor 70 is electrically connected between the reference potential wire 113F and the anode wire 112F (see FIGS. 13A and 15).

Next, a path along which heat generated by the light source 20 is released in the light-emitting device 4 to which the second exemplary embodiment is applied is described with reference to FIG. 15.

As described above, heat generated by the light source 20 transfers along a path from the cathode electrode 214 of the light source 20 to the cathode wire 111F provided on the front surface side of the heat releasing base member 100. Then, the heat transfers to the cathode wire 111B, the anode wire 112B, and the reference potential wire 113B provided on the rear surface side of the heat releasing base member 100 through the heat releasing base member 100. However, the cathode wire 11 and the anode wire 12 of the wiring substrate 10 to which the cathode wire 111B and the anode wire 112B are connected are not connected to the reference potential wire 13B provided on the rear surface side of the wiring substrate 10. Accordingly, heat is released from the cathode wire 11 and the anode wire 12 through the wiring substrate 10 having low thermal conductivity. However, the reference potential wire 113B is connected to the reference potential wire 13B provided on the rear surface side of the wiring substrate 10 through the reference potential wire 13F and the through conductor 13V of the wiring substrate 10. Accordingly, heat transfers to the reference potential wire 13B provided on the rear surface side of the wiring substrate 10 through the reference potential wire 113B and the reference potential wire 13F and the through conductor 13V of the wiring substrate 10 (path y in FIG. 15).

In the light-emitting device 4 to which the second exemplary embodiment is applied, a distance from the cathode electrode 214 of the light source 20 to the reference potential wire 113B provided on the heat releasing base member 100 is larger than that in the light-emitting device 4 (see FIG. 9) to which the first exemplary embodiment is applied. However, in a case where the heat releasing base member 100 has high thermal conductivity, heat generated by the light source 20 easily transfers to the reference potential wire 113B through the heat releasing base member 100. Accordingly, heat generated by the light source 20 is released more easily than in a case where the heat releasing base member 100 is not provided with the reference potential wire 113B.

As described above, in the light-emitting device 4 to which the second exemplary embodiment is applied, heat generated by the light source 20 is released along a path passing the cathode wire 111F provided on the front surface side of the heat releasing base member 100, the heat releasing base member 100, the reference potential wire 113B provided on the rear surface side of the heat releasing base member 100, the reference potential wire 13F provided on the front surface side of the wiring substrate 10, the through conductor 13V, and the reference potential wire 13B provided on the rear surface side of the wiring substrate 10 in this order, as in the light-emitting device 4 to which the first exemplary embodiment is applied.

Planar shapes of the cathode wire 111F, the anode wire 112F, and the reference potential wire 113F provided on the front surface side of the heat releasing base member 100 may be identical to planar shapes of the cathode wire 111B, the anode wire 112B, and the reference potential wire 113B provided on the rear surface side of the heat releasing base member 100. That is, the reference potential wire 113B and the cathode wire 111F need not be provided so as to overlap each other in top view, as described for the light-emitting device 4 to which the first exemplary embodiment is applied. Similarly, the reference potential wire 113B and the light source 20 need not be provided so as to overlap each other in top view.

In the light-emitting device 4 to which the second exemplary embodiment is applied, the VCSELs (the light source 20) and the capacitors 70A and 70B are provided on the front surface of the heat releasing base member 100, as in the light-emitting device 4 to which the first exemplary embodiment is applied. This shortens a distance from the capacitors 70A and 70B to the VCSELs (the light source 20), thereby shortening a rise time of light emission of the VCSELs.

As described above, in the light-emitting device 4 to which the first exemplary embodiment is applied and the light-emitting device 4 to which the second exemplary embodiment is applied, the reference potential wires 113F and 113B are provided on the heat releasing base member 100, and therefore a path along which heat generated by the light source 20 transfers to the reference potential wire 13B provided on the rear surface side of the wiring substrate 10 through the reference potential wire 13F provided on the front surface side of the wiring substrate 10 and the through conductor 13V provided in the wiring substrate 10 is formed. As illustrated in FIG. 9, it is only necessary that heat generated by the light source 20 transfer to the reference potential wire 113B provided on the rear surface side of the heat releasing base member 100, and therefore it is only necessary that the reference potential wire 113B be provided on the rear surface side of the heat releasing base member 100.

In the light-emitting device 4 to which the first exemplary embodiment is applied and the light-emitting device 4 to which the second exemplary embodiment is applied, the capacitor 70 is provided on the front surface side of the heat releasing base member 100, but other circuit elements (e.g., a capacitor, a resistive element) may be also provided on the front surface side of the heat releasing base member 100.

A component connected to the reference potential wires 113F and 113B provided on the heat releasing base member 100 is not limited to the capacitors 70 (70A and 70B) for supplying an electric charge (electric current) for causing the light source 20 to emit light and may be a circuit component (e.g., a capacitor, a resistive element) for other functions.

An electrically-conductive pattern that is not connected to the circuit component (e.g., a capacitor, a resistive element) may be provided on the rear surface side of the heat releasing base member 100, and this electrically-conductive pattern may be connected to the reference potential wire 13B of the wiring substrate 10.

In the first exemplary embodiment and the second exemplary embodiment, the light diffusing member 30 for outputting incident light after changing a spread angle of the incident light to a larger angle by diffusion is used as an example of an optical member. The optical member may be, for example, a diffractive optical element (DOE) for outputting incident light after changing a direction of the incident light to a different direction. Alternatively, the optical member may be a transparent member such as a light focusing lens, a microlens, or a protection cover.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light-emitting device comprising:
an insulating base member having thermal conductivity of 10 W/m·K or more;
a light-emitting element provided on a front surface side of the base member;
a first rear surface conductive pattern that is provided on a rear surface side of the base member and is connected to cathode electrode of the light-emitting element;
a second rear surface conductive pattern that is provided on the rear surface side of the base member and is connected to the anode electrode; and
a reference potential conductive pattern that is provided on the rear surface side of the base member and is connected to an external reference potential;
a first front surface conductive pattern that is provided on the front surface side of the base member and is connected to the first rear surface conductive pattern;
a second front surface conductive pattern that is provided on the front surface side of the base member and is connected to the second rear surface conductive pattern;
a capacitive element that is provided on the front surface side of the base member, wherein a portion of the capacitive element is provided on the second front surface conductive pattern, and the capacitive element is connected to the reference potential conductive pattern, and supplies an electric charge to the light-emitting element;
wherein the light-emitting element is provided on the first front surface conductive pattern, and
wherein the reference potential conductive pattern overlaps more with the capacitive element than the light-emitting element in a top view of the light-emitting device, and the first rear surface conductive pattern overlaps more with the light-emitting element than the capacitive element in the top view.

2. The light-emitting device according to claim 1, wherein the reference potential conductive pattern overlaps at least part of the first front surface conductive pattern in the top view.

3. The light-emitting device according to claim 1, wherein the reference potential conductive wire overlaps at least part of the light-emitting element in the top view.

4. The light-emitting device according to claim 2, wherein the reference potential conductive pattern overlaps at least part of the light-emitting element in the top view.

5. The light-emitting device according to claim 1, wherein an area of the reference potential conductive pattern is larger than an area of the first rear surface conductive pattern and an area of the second rear surface conductive pattern.

6. The light-emitting device according to claim 1, further comprising a driving unit that is connected to the light-emitting element and low-side-drives the light-emitting element.

7. An optical device comprising:
the light-emitting device according to claim 1; and
a light receiving unit that receives light emitted from the light-emitting element of the light-emitting device and then reflected by an object to be measured,
wherein the light receiving unit outputs a signal corresponding to a period from the emission of the light from the light-emitting element to the reception of the light by the light receiving unit.

8. An information processing apparatus comprising:
the optical device according to claim 7; and
a shape specifying unit that specifies a three-dimensional shape of an object to be measured on a basis of light emitted from a light source of the optical device, reflected by the object to be measured, and then received by the light receiving unit of the optical device.

9. The information processing apparatus according to claim 8, further comprising an authentication processing unit that performs authentication processing concerning use of the information processing apparatus on a basis of the three-dimensional shape of the object to be measured specified by the shape specifying unit.

* * * * *